(12) United States Patent
Mano et al.

(10) Patent No.: US 10,866,491 B2
(45) Date of Patent: Dec. 15, 2020

(54) ELECTRONIC APPARATUS HAVING HEAT DISSIPATION SYSTEM

(71) Applicant: CANON KABUSHIKI KAISHA, Tokyo (JP)

(72) Inventors: Hayato Mano, Tokyo (JP); Kazuna Oyama, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/351,946

(22) Filed: Mar. 13, 2019

(65) Prior Publication Data
US 2019/0285970 A1 Sep. 19, 2019

(30) Foreign Application Priority Data
Mar. 19, 2018 (JP) ................................ 2018-051131

(51) Int. Cl.
| G03B 17/55 | (2006.01) |
| H05K 7/20 | (2006.01) |
| H04N 5/225 | (2006.01) |

(52) U.S. Cl.
CPC ........... *G03B 17/55* (2013.01); *H04N 5/2252* (2013.01); *H04N 5/22521* (2018.08); *H05K 7/20145* (2013.01); *H05K 7/20172* (2013.01)

(58) Field of Classification Search
CPC .. G03B 17/55; H04N 5/2252; H04N 5/22521; H05K 7/20145; H05K 7/20172
See application file for complete search history.

(56) References Cited

U.S. PATENT DOCUMENTS

| 10,488,895 B2* | 11/2019 | Schubert | G06F 1/20 |
| 2014/0110089 A1* | 4/2014 | Lin | H01L 23/467 |
| | | | 165/121 |
| 2015/0036284 A1* | 2/2015 | Ross | H05K 7/1489 |
| | | | 361/679.46 |
| 2015/0062805 A1* | 3/2015 | Katsumata | F28D 15/0275 |
| | | | 361/679.49 |
| 2017/0354060 A1* | 12/2017 | Pedoeem | H05K 7/20145 |
| 2018/0376037 A1* | 12/2018 | Arai | H05K 7/20409 |
| 2019/0033932 A1* | 1/2019 | Ku | B64D 33/08 |

FOREIGN PATENT DOCUMENTS

| JP | 2015186255 A | 10/2015 |
| JP | 2017139584 A | 8/2017 |

* cited by examiner

*Primary Examiner* — Amy R Hsu
(74) *Attorney, Agent, or Firm* — Rossi, Kimms & McDowell LLP

(57) ABSTRACT

An electronic apparatus that is capable of cooling heat sources efficiently by taking in outside air through intake ports effectively while reducing the number of components. The electronic apparatus obtains an image signal corresponding to an optical image formed through an image pickup lens. A first heat generating element is implemented in a first substrate. A second heat generating element is implemented in a second substrate. A first duct is connected to the first heat generating element at a position nearer to an exhaust port formed in a housing of the electronic apparatus than a first blower that sends air to the first duct. A second duct is connected to the second heat generating element at a position nearer to the exhaust port than a second blower that sends air to the second duct.

7 Claims, 19 Drawing Sheets

ELECTRONIC APPARATUS HAVING HEAT DISSIPATION SYSTEM

BACKGROUND OF THE INVENTION

Field of the Invention

The present invention relates to an electronic apparatus, and in particular, relates to the electronic apparatus having a heat dissipation system with a fan.

Description of the Related Art

Generally, an image pickup apparatus, such as a video camera that is one of electronic apparatuses, has heat sources, such as a main process substrate and a sensor substrate. Furthermore, the image pickup apparatus like a video camera has an external output terminal for outputting a video signal obtained by photographing to an external monitor etc.

In such an image pickup apparatus, heat generated by the heat sources mentioned above may affect electric elements implemented in a substrate and may cause an obstacle of the substrate. Moreover, the heat sources may make an exterior of the image pickup apparatus hot, which may give displeasure to a user who holds the image pickup apparatus.

In addition, when an image pickup lens unit in the image pickup apparatus is partially warmed, a warmed portion expands thermally in comparison with a portion that is not warmed. As a result, the shape of the image pickup lens unit may become asymmetrical, which may give a bad influence, such as increase of lens aberration in a photographed image.

In order to prevent such inconvenience caused by heat, it is necessary to discharge the heat generated by the heat sources to the exterior of the image pickup apparatus. For example, forced air cooling using a fan is one of methods of discharging heat effectively. The forced air cooling cools the inside of the image pickup apparatus using air taken in from the outside of the image pickup apparatus with the fan. Then, the warmed air is discharged to the exterior of the image pickup apparatus.

There is an image pickup apparatus that cools its inside with the forced air cooling using a centrifugal fan and a duct (Japanese Laid-Open Patent Publication (Kokai) No. 2015-186255 (JP 2015-186255A)).

Moreover, there is an image pickup apparatus that is provided with a plurality of intake ports for the forced air cooling and discharges heat efficiently (Japanese Laid-Open Patent Publication (Kokai) No. 2017-139584 (JP 2017-139584A)).

However, in the image pickup apparatus disclosed in JP 2015-186255A, the centrifugal fan is arranged on the way of a flow path (duct) and a direction of an intake port intersects with a direction of an exhaust port. Accordingly, the apparatus disclosed in JP 2015-186255A is provided with the intake port and the exhaust port independently in order to simplify the shape of the duct. As a result, the number of components that constitute the duct increases.

Moreover, when the plurality of intake ports are provided as the image pickup apparatus disclosed in JP 2017-139584A, a plurality of fans are needed to take in outside air through the plurality of intake ports effectively. Because when a single fan is provided in the apparatus that has the plurality of intake ports, difference in ventilation resistance occurs in the air flow paths, which disturbs efficient cooling of the heat sources.

However, when a fan is provided to each of the plurality of intake ports, the image pickup apparatus is enlarged and the cost increases because the number of components increases.

SUMMARY OF THE INVENTION

The present invention provides an electronic apparatus that is capable of cooling heat sources efficiently by taking in outside air through intake ports effectively while reducing the number of components.

Accordingly, a first aspect of the present invention provides an electronic apparatus that obtains an image signal corresponding to an optical image formed through an image pickup lens, the electronic apparatus including a first substrate in which a first heat generating element is implemented, a second substrate in which a second heat generating element is implemented, a first duct connected to the first heat generating element, a second duct connected to the second heat generating element, a first blower that sends air to the first duct; and a second blower that sends air to the second duct. The first duct is connected to the first heat generating element at a position nearer to an exhaust port formed in a housing of the electronic apparatus than the first blower. The second duct is connected to the second heat generating element at a position nearer to the exhaust port than the second blower.

Accordingly, a second aspect of the present invention provides an electronic apparatus that obtains an image signal corresponding to an optical image formed through an image pickup lens, the electronic apparatus including a first substrate in which a first heat generating element is implemented and is arranged at a side of a grip formed in a housing of the electronic apparatus, a second substrate in which a second heat generating element is implemented and is arranged at a side opposite to an image pickup direction of the image pickup lens, a third substrate in which a third heat generating element is implemented and is arranged at a position nearer to a bottom of the electronic apparatus than the image pickup lens, a first duct having a first connection part that connects to the first heat generating element thermally, a second duct having a second connection part and a third connection part that respectively connect to the second substrate and the third substrate thermally, a first blower that is connected to the first duct, and a second blower that is connected to the second duct.

According to the present invention, the heat sources are cooled efficiently by taking in outside air through intake ports effectively while reducing the number of components.

Further features of the present invention will become apparent from the following description of exemplary embodiments with reference to the attached drawings.

DESCRIPTION OF THE EMBODIMENTS

Figure 1A:
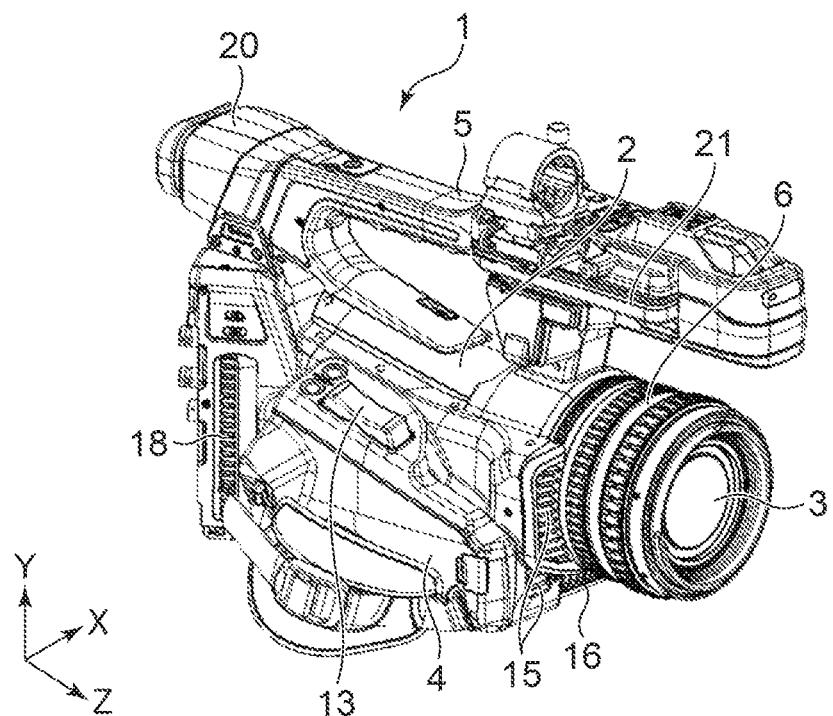
FIG. 1A and FIG. 1B are perspective views for describing an example of an image pickup apparatus (a camera) that is an electronic apparatus according to a first embodiment of the present invention.

Hereafter, an example of an electronic apparatus according to an embodiment of the present invention will be described by referring to the drawings.

Figure 1B:
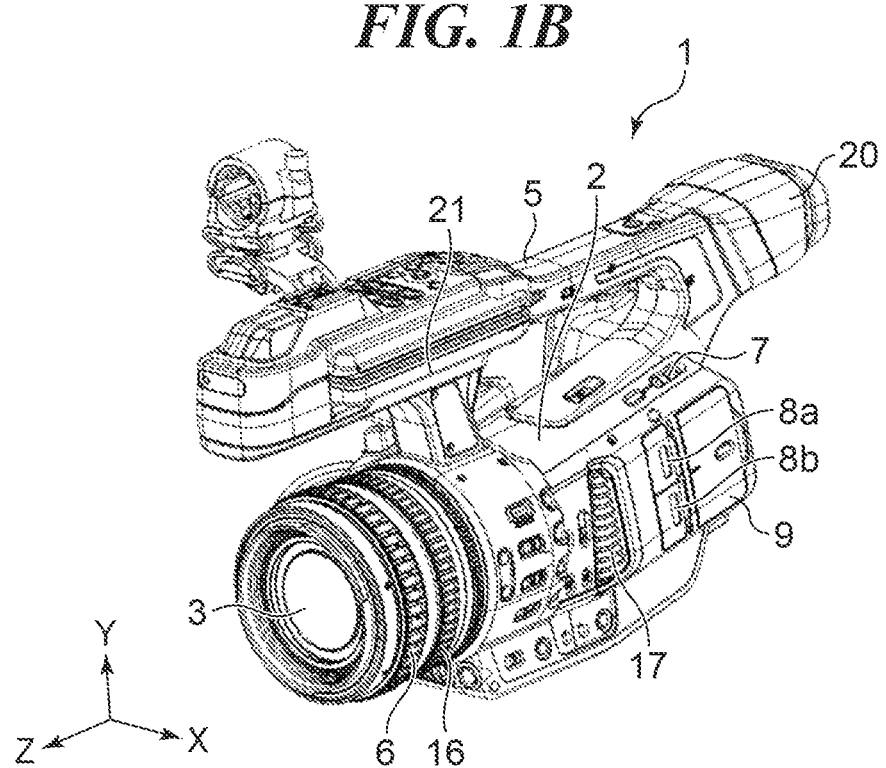
Figure 2A:
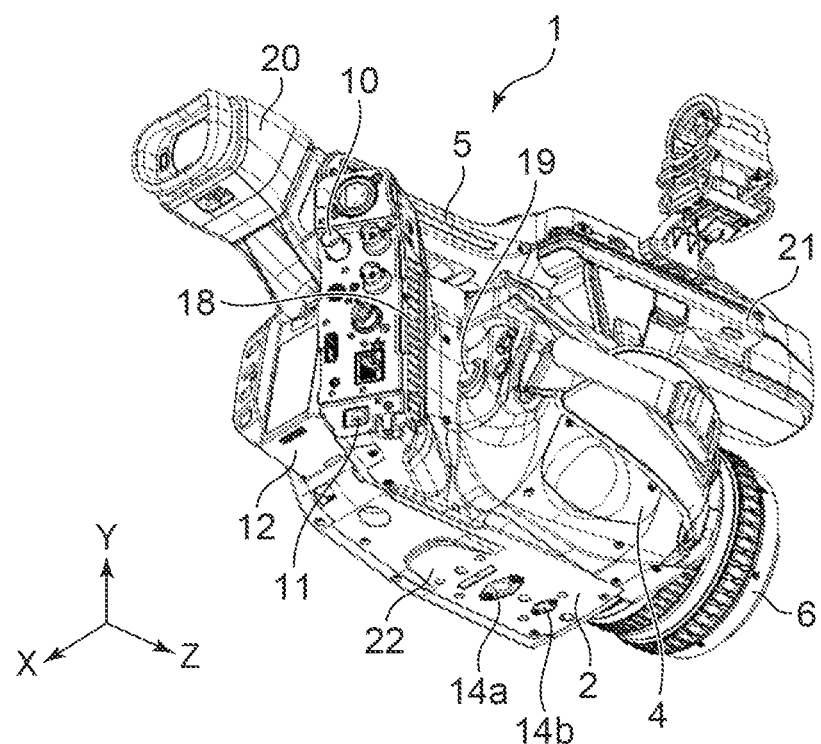
FIG. 2A and FIG. 2B are a perspective view and a front view for describing the camera shown in FIG. 1A and FIG. 1B.
Figure 2B:
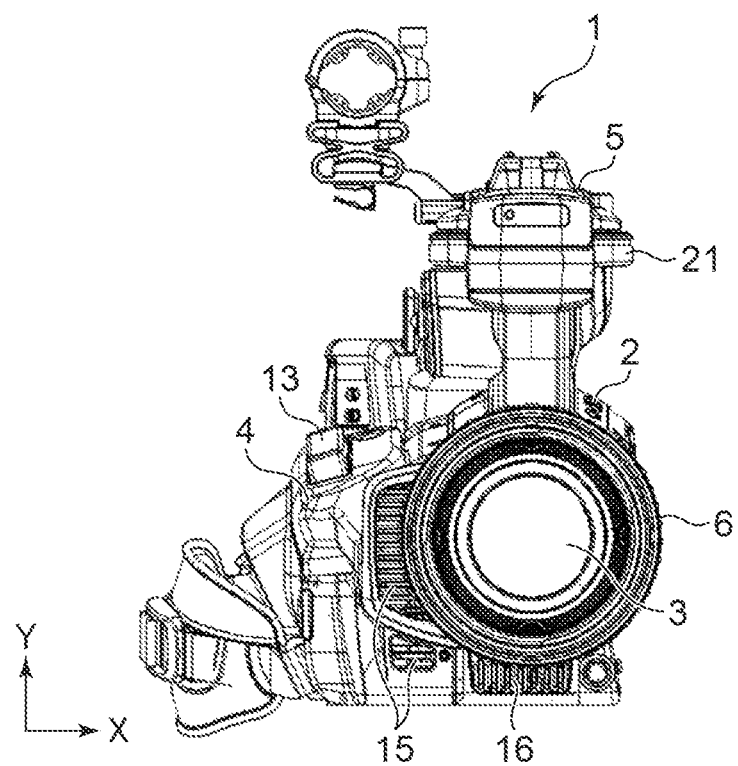

FIG. 1A, FIG. 1B, FIG. 2A, and FIG. 2B are views for describing an example of an image pickup apparatus that is an electronic apparatus according to a first embodiment of the present invention. It should be noted that an X-axis is defined in a left-and-right direction (a left side is "+" and a right side is "−") viewed from a user who uses the image pickup apparatus, a Y-axis is defined in a vertical direction (an upper side is "+" and a bottom side is "−"), and a Z-axis is defined in a front-and-rear direction (a front side is "+" and a rear side is "−") as shown in the drawings. FIG. 1A is a perspective view viewed from a front-right side, and FIG. 1B is a perspective view viewed from a front-left side. Moreover, FIG. 2A is a perspective view viewed from a rear-bottom side, and FIG. 2B is a front view.

For example, the illustrated image pickup apparatus is a digital video camera (hereinafter referred to as a camera, simply) 1 that has a camera body 2, an image pickup lens unit (hereinafter referred to as an image pickup lens) 3, a grip 4, a handle 5, and an operation ring 6.

The camera body 2 includes components, such as a main control substrate that controls the entire camera 1, a power source unit, a recording unit, and various operation units. The camera body 2 is provided with a power switch 7, media lids 8a and 8b that protect card media, and an audio lid 9. It should be noted that the audio lid 9 prevents operating operation keys, such as an audio dial, carelessly.

Furthermore, the camera body 2 is provided with terminals, such as an SDI output terminal 10 and a DC jack terminal 11, and the battery 12. Female tripod screws 14a and 14b for photographing using a tripod are formed in a bottom cover 22 located in the bottom side (−Y side) of the camera body 2. When a photographer (user) performs high-angle photographing or low-angle photographing, the photographer uses the camera 1 while putting a hand to the bottom cover 22.

The camera body 2 is provided with a forced air-cooling mechanism having fans in order to cool various elements mounted on substrates, such as the main control substrate. This forced cooling mechanism is provided with a first body intake port 15 that opens in the front direction (+Z direction) at the right side (−X side) of the camera body 2. Furthermore, the mechanism is provided with a second body intake port 16 that opens in the front direction (+Z direction) near the bottom side (−Y side) of the camera body 2. Furthermore, the mechanism is provided with a third body intake port 17 that opens in the left direction (+X direction) at the left side (+X side) of the camera body 2.

Moreover, the forced cooling mechanism is provided with a body exhaust port 18 at the right side (−X side) of the camera body 2. The body exhaust port 18 is formed at such a position that exhaust wind does not hit a right hand and a face when a photographer holds the grip 4 with the right hand. For example, the body exhaust port 18 opens at the position that is near the rear side (−Z side) than the grip 4 in the direction between the rear direction (−Z direction) and the right direction (−X direction).

The illustrated camera 1 is so configured that the image pickup lens 3 and the camera body 2 are united into one body. The image pickup lens 3 has a plurality of movable optical elements, such as lens groups and a diaphragm, and actuators that drive the lens groups and the diaphragm. Then, an object light beam that is entered through the image pickup lens 3 forms an optical image on an image pickup device provided in the camera body 2. The image pickup device outputs an image signal corresponding to the optical image. A main image processing substrate mentioned later will apply predetermined image processes to the image signal.

It should be noted that the actuators move the lens groups for zooming (for changing a field angle of a photographing image) and for focusing (for adjusting focus on an object), and drive the diaphragm for adjusting the light receiving amount.

The photographer is able to hold the camera 1 in one's eye level during photographing by gripping the grip 4. The grip 4 is provided with various operation keys, such as a zoom key 13 that operates the actuator concerning the image pickup lens 3, a trigger key 19 that instructs start and stop of recording. The photographer is able to perform various operations smoothly by a single hand using the operation keys provided in the grip 4 during photographing.

When the photographer grips the camera 1 by one hand and uses, the operational feeling in a case where the camera 1 is gripped by a dominant hand is more favorable than that in a case where the camera 1 is gripped by the other hand.

Generally, since there are many right-handed persons, the grip 4 of the illustrated camera 1 is provided in the right side (−X side) of the camera body 2 as one body.

The handle 5 is a ring-shaped part located at the upper side (+Y side) of the camera body 2. The handle 5 is used when the camera 1 is carried and when low-angle photographing is performed where the camera 1 is in a position lower than the photographer's eye level, such as a position of a belly of the photographer or a position near a floor while bending a body. An electronic view finder 20 and a display panel 21 by which the photographer checks a picked-up image or a menu are mounted on the handle 5.

The operation ring 6 is a ring-shaped operation member rotatably arranged around the image pickup lens 3 centering the optical axis of the image pickup lens and is provided with three operation rings in the illustrated example. The three operation rings are used for zooming, focusing, and adjusting the diaphragm, respectively. The rotational operations of the operation rings by the photographer enable zooming, focusing, and adjusting the diaphragm.

Although the camera 1 has various other components for recording a moving image, their descriptions are omitted.

Figure 3A:
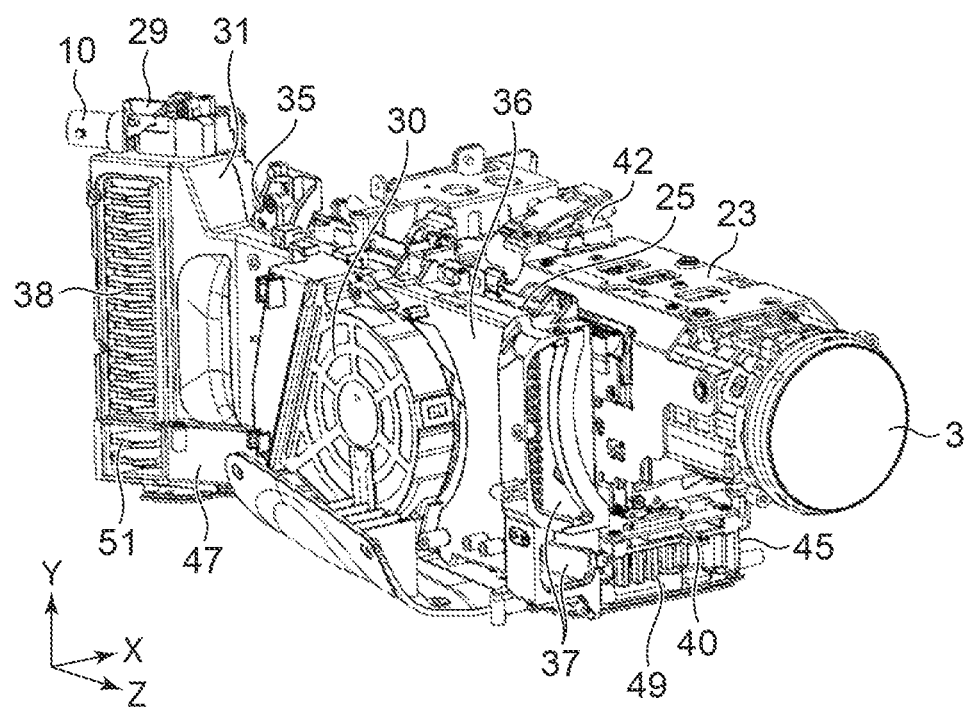
FIG. 3A and FIG. 3B are perspective views for describing one example of a heat dissipation mechanism of the camera shown in FIG. 1A and FIG. 1B.
Figure 3B:
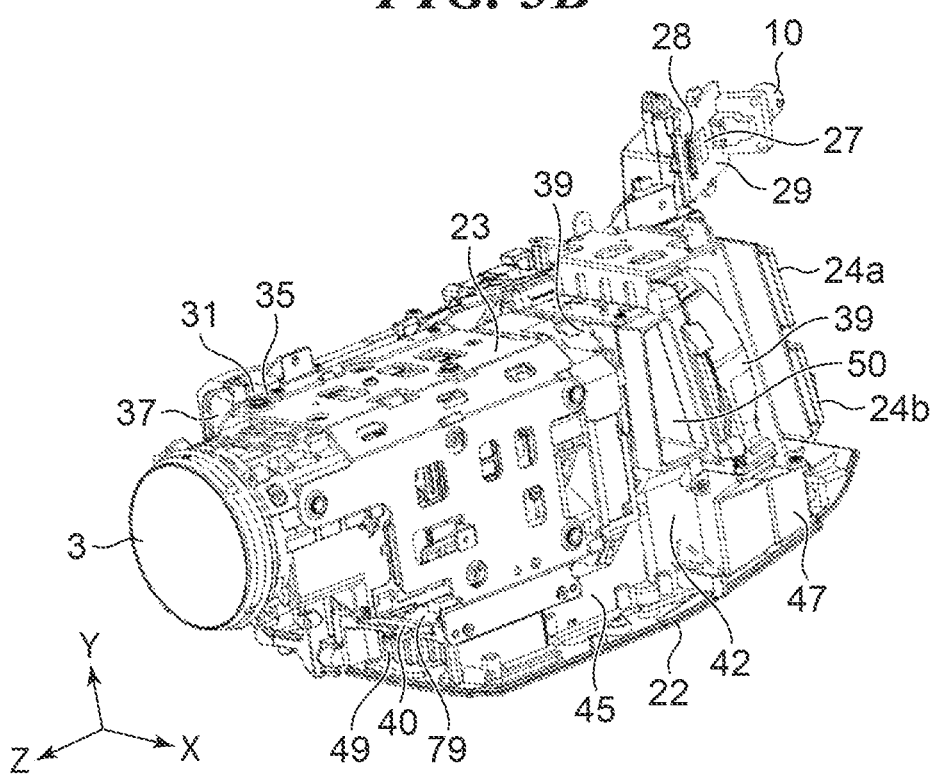

FIG. 3A and FIG. 3B are perspective views for describing one example of a heat dissipation mechanism of the camera shown in FIG. 1A and FIG. 1B. FIG. 3A is the perspective view viewed from the front-right side in a state where an exterior of the camera is detached, and FIG. 3B is the perspective view viewed from the front-left side in the state where the exterior of a camera is detached. The heat dissipation mechanism is provided with a first heat dissipation system and a second heat dissipation system. FIG. 3A and FIG. 3B show the image pickup lens 3, a lens holder 23, the first heat dissipation system, and the second heat dissipation system.

Figure 4A:
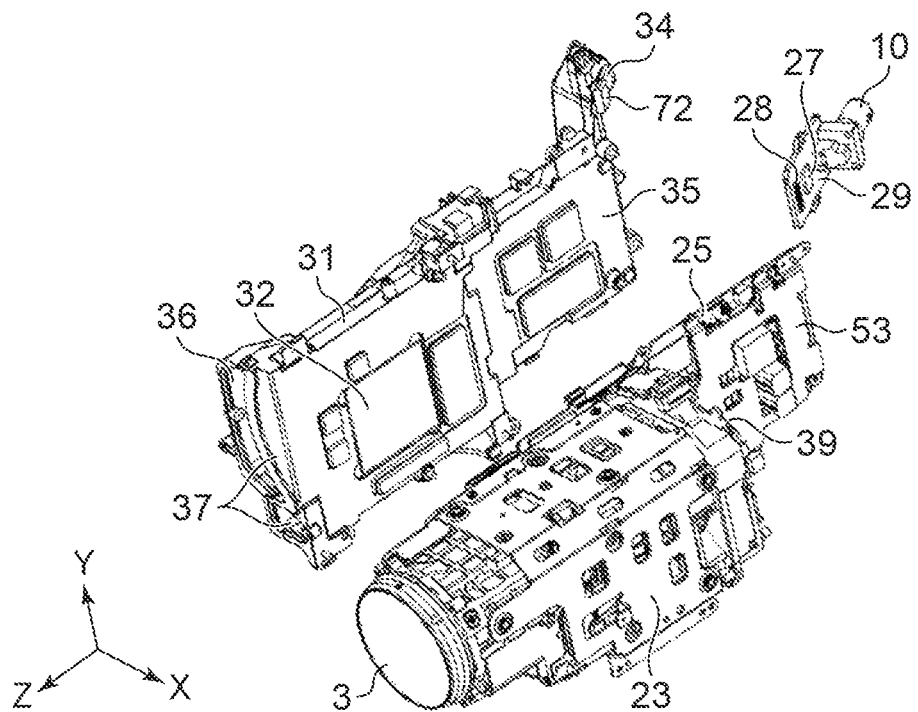
FIG. 4A and FIG. 4B are exploded perspective views for describing a first heat dissipation system in the heat dissipation mechanism shown in FIG. 3A and FIG. 3B.
Figure 4B:
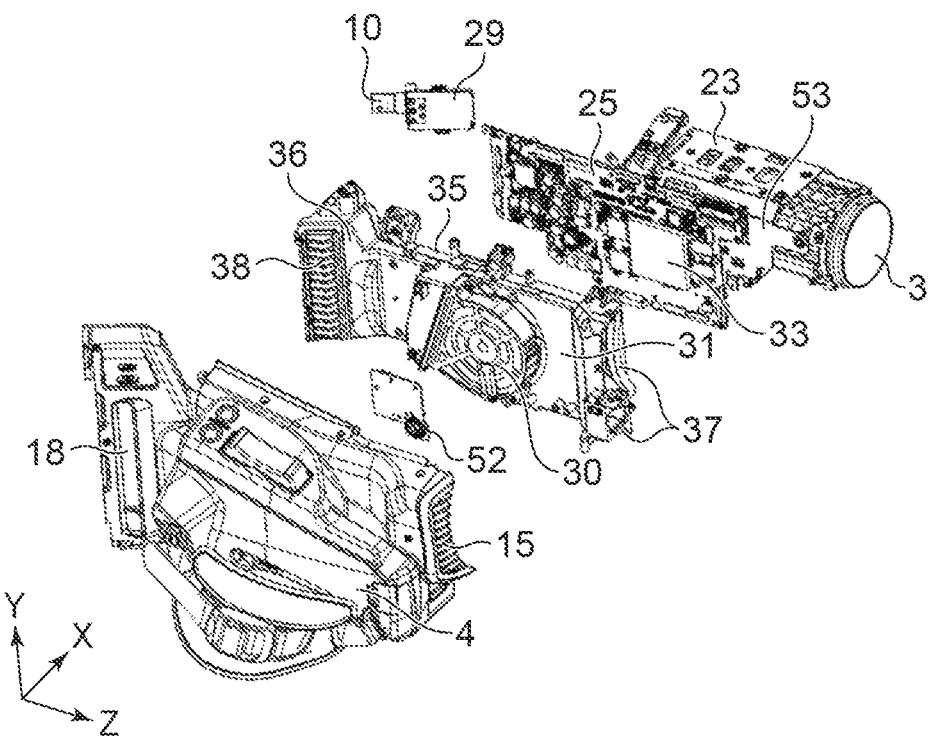

FIG. 4A and FIG. 4B are exploded perspective views for describing the first heat dissipation system in the heat dissipation mechanism shown in FIG. 3A and FIG. 3B. FIG. 4A is the exploded perspective view showing the first heat dissipation system viewed from an upper-left side, and FIG. 4B is the exploded perspective view showing the first heat dissipation system viewed from an upper-right side. FIG. 4A shows the image pickup lens 3 and the first heat dissipation system. FIG. 4B shows the image pickup lens 3, the first heat dissipation system, a button battery 52, and the grip 4.

The first heat dissipation system cools the main control substrate 25 on which an image processing element and a power source element are mounted and an SDI substrate 29. The SDI output terminal 10, a heat generating element 27, and a connector 28 are implemented in the SDI substrate 29.

The first heat dissipation system is provided with a first centrifugal fan (ventilation unit, blower) 30, a first duct (duct portion) 31, a first heat conduction member 32, and a second heat conduction member 34. The first duct 31 is a duct through which air circulates (flows) by driving the first centrifugal fan 30. The first heat conduction member 32 intervenes between the first duct 31 and a heat generating element 33 implemented in the main control substrate 25. The second heat conduction member 34 intervenes between the first duct 31 and the SDI substrate 29.

The first duct 31 has a first heat sink member 35 and a duct lid 36. The first heat sink member 35 thermally contacts the first heat conduction member 32 and second heat conduction member 34. Heat conductivity of the duct lid 36 is lower than that of the first heat sink member 35. In the illustrated example, thermally conductive elastic members are used as the first heat conduction member (connection part) 32 and the second heat conduction member 34. Moreover, the first heat sink member 35 is molded by aluminum die casting, and the duct lid 36 is molded with resin material.

A first intake port 37 connected with the first body intake port 15 formed in a housing of the camera 1 is formed in the first duct 31. Furthermore, a first exhaust port 38 connected with the body exhaust port 18 is formed in the first duct 31.

Air is inhaled from the first body intake port 15 by driving the first centrifugal fan 30. Then, the air passing through the first intake port 37 from the first body intake port 15 reaches the first heat sink member 35, the first heat conduction member 32, and the second heat conduction member 34, and cools the heat generating element 27 and the heat generating element 33. After that, the air is discharged from the body exhaust port 18 through the first exhaust port 38.

It should be noted that the space prescribed by the first duct 31 is independent from the other space of the camera 1. Accordingly, even if dust or waterdrop flows in from the first body intake port 15, the dust or waterdrop does not leak to the other space from the space prescribed by the first duct 31.

A plurality of heat generating elements other than the heat generating element 33 are implemented in the main control substrate 25 and are cooled by connecting to the first duct 31 through heat conduction members in the same manner as the heat generating element 33.

Figure 5A:
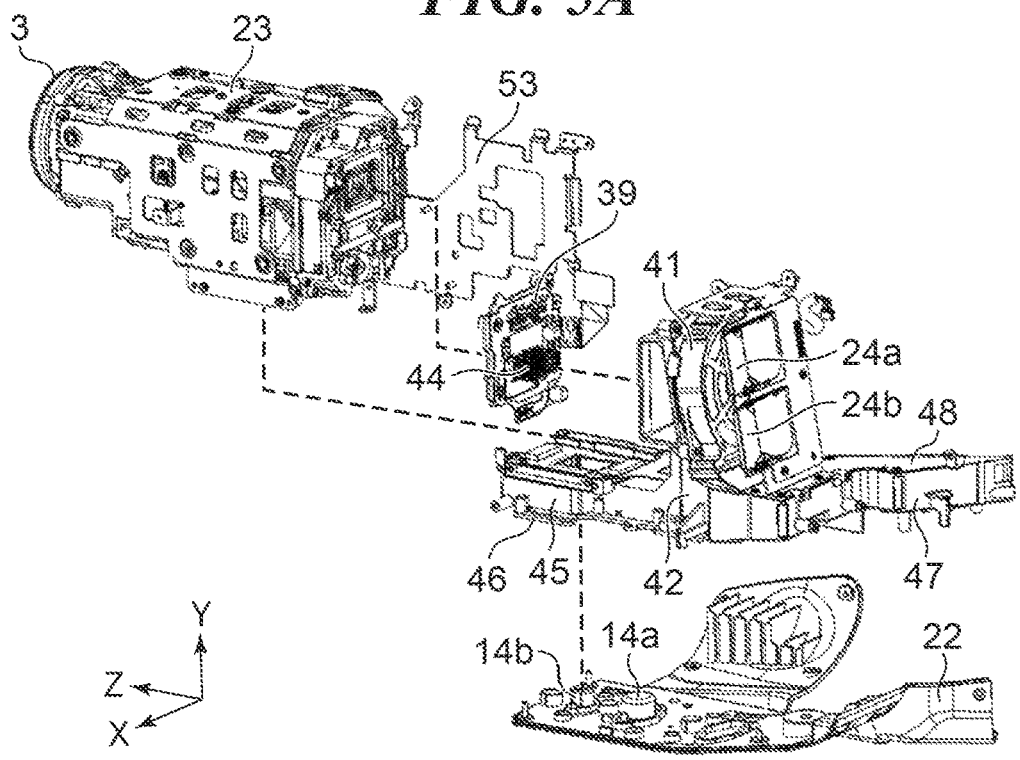
FIG. 5A and FIG. 5B are exploded perspective views for describing a second heat dissipation system in the heat dissipation mechanism shown in FIG. 3A and FIG. 3B.
Figure 5B:
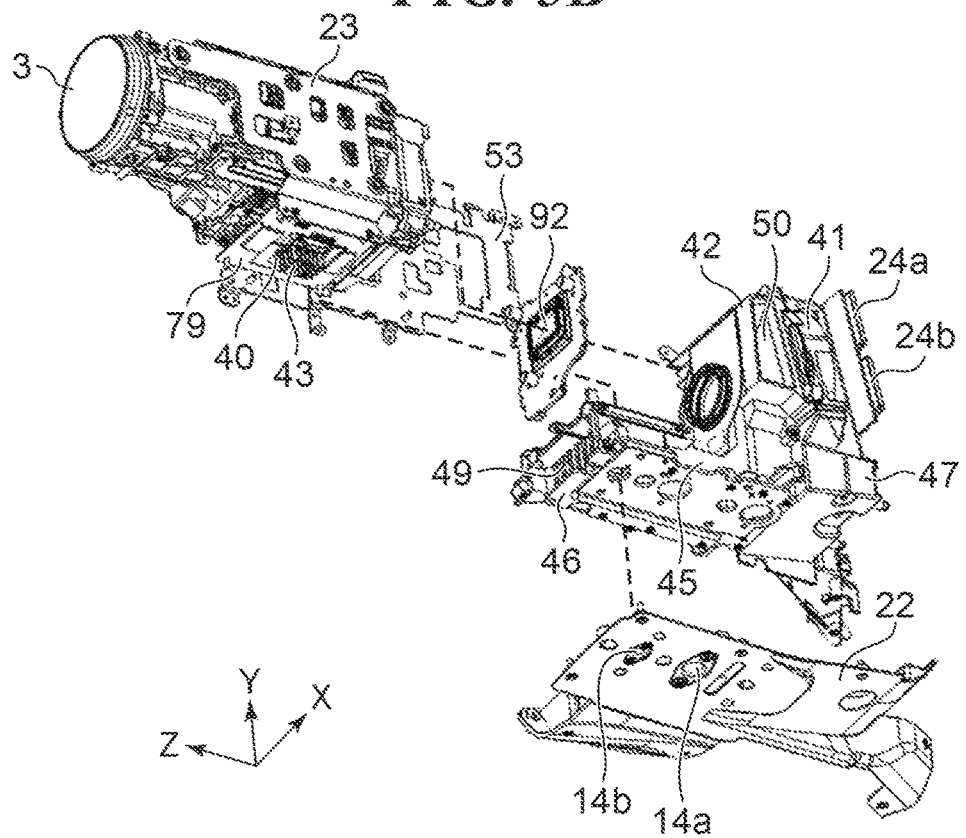

FIG. 5A and FIG. 5B are exploded perspective views for describing the second heat dissipation system in the heat dissipation mechanism shown in FIG. 3A and FIG. 3B. FIG. 5A is the exploded perspective view showing the second heat dissipation system viewed from a rear-left side, and FIG. 5B is the exploded perspective view showing the second heat dissipation system viewed from a bottom-left side. It should be noted that FIG. 5A and FIG. 5B show the image pickup lens 3, the second heat dissipation system, and the lens holder 23 in a state developed in the two axial directions of the Z-axis and the Y-axis. Then, the development directions are shown by broken lines.

The second heat dissipation system cools a sensor substrate 39 in which the image pickup device 92 is implemented and a codec substrate 79 in which a heat generating element 40 is implemented. The second heat dissipation system is provided with a second centrifugal fan 41, a second duct 42, a second heat sink member 43, and a third heat sink member 44.

The second duct 42 is a duct through which air flows by driving the second centrifugal fan 41. The second heat sink member 43 contacts the heat generating element 40 and is exposed in the second duct 42. The third heat sink member 44 contacts the sensor substrate 39 and is exposed in the second duct 42.

The second duct 42 has an air intake duct 45, an air intake duct plate 46 whose heat conductivity is higher than that of the air intake duct 45, an exhaust duct 47, and the exhaust duct plate 48. In the illustrated example, the second heat sink member 43 and third heat sink member 44 are made from aluminum, and the air intake duct 45 and exhaust duct 47 are made from resin.

Moreover, the air intake duct plate 46 and exhaust duct plate 48 are made from stainless steel. The bottom cover 22 made from resin and the female tripod screws 14a and 14b made from stainless steel are fixed to the air intake duct plate 46.

A second intake port 49, a third intake port 50, and a second exhaust port 51 are formed in the second duct 42. The second intake port 49 is connected with the second body intake port 16 (FIG. 2B), and the third intake port 50 is connected with the third body intake port 17 (FIG. 1B).

Moreover, the second exhaust port 51 is connected with the body exhaust port 18 (FIG. 1B).

Air is inhaled from the second intake port 49 through the second body intake port 16 by driving the second centrifugal fan 41. Then, the heat generating element 40 is cooled by the air concerned through the second heat sink member 43. After that, the air passes through the exhaust duct 47 and is discharged from the body exhaust port 18 through the second exhaust port 51.

Furthermore, air is inhaled from the third intake port 50 through the third body intake port 17 by driving the second centrifugal fan 41. Then, the sensor substrate 39 is cooled by the air concerned through the third heat sink member 44. After that, the air passes through the exhaust duct 47 and is discharged from the body exhaust port 18 through the second exhaust port 51.

It should be noted that the space prescribed by the second duct 42 is independent from the other space of the camera 1. Accordingly, even if dust or waterdrop flows in from the second body intake port 16 or the third body intake port 17 due to the drive of the second centrifugal fan 41, the dust or waterdrop does not leak to the other space from the space prescribed by the second duct 42.

Figure 6:
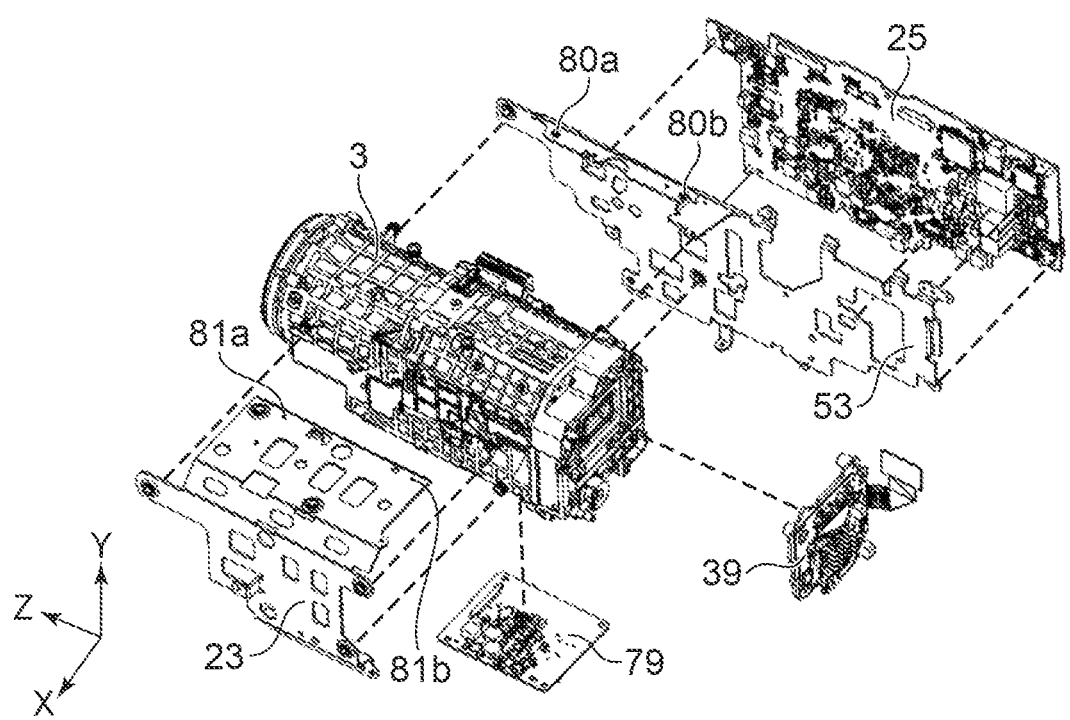
FIG. 6 is an exploded perspective view showing a mechanism around a photographing lens shown in FIG. 4A viewed from an upper side.

FIG. 6 is an exploded perspective view showing a mechanism around the image pickup lens 3 shown in FIG. 4A viewed from the upper side. FIG. 6 shows the image pickup lens 3, a heat generating source, the lens holder 23, and a main holder 53, and shows the development directions by broken lines.

The main control substrate 25 in which the heat generating element 33 (FIG. 4B) is implemented is arranged at the right side (−X side) of the image pickup lens 3. Moreover, the codec substrate 79 in which the heat generating element 40 (FIG. 5B) is implemented is arranged at the bottom side (−Y side) of the image pickup lens 3. Furthermore, the sensor substrate 39 in which the image pickup device 92 was implemented is arranged at the rear side (−Z side) of the image pickup lens 3.

As illustrated, the metal lens holder 23, which is positioned at the upper side (+Y side) and the left side (+X side) of the image pickup lens 3, is fixed to the metal main holder 53 by tightening screws 80a and 80b to screw holes 81a and 81b, respectively. Then, the main control substrate 25 in which the heat generating element 33 (FIG. 4B) is implemented is fixed to the main holder 53.

Accordingly, the heat sources and the metal members that are connected with the heat sources are arranged around the image pickup lens 3 at the sides except the front side (+Z side) of the image pickup lens 3. As a result, the temperature around the image pickup lens 3 becomes approximately uniform, which prevents degradation of optical performance, such as degradation of lens aberration, resulting from the temperature difference in the image pickup lens 3.

It should be noted that the positional relationships between the heat sources and the metal members that are connected with the heat sources are not limited to the above-mentioned positional relationships. For example, the heat sources or the metal members that are connected with the heat sources may be arranged at five sides around the image pickup lens 3 except the front side (+Z side).

Furthermore, as shown in FIG. 4B, the first duct 31, the button battery 52, and the grip 4 are arranged in this order at the right side (−X side) of the main control substrate 25. Outside air (air) flows through the first duct 31 by driving the first centrifugal fan 30. This intercepts the heat that is generated by the main control substrate 25 and is transferred to the button battery 52 and the grip 4. As a result of this, the button battery (a thermally vulnerable member) 52, which is easily affected by heat, is protected from the heat of the main control substrate 25.

Moreover, since the heat from the main control substrate 25 does not transfer to the grip 4 that is a main grip of the camera 1, a photographer who holds the grip 4 does not feel discomfort. Since the duct lid 36 made from resin of which heat conductivity is lower than that of metal is arranged between the first heat sink member 35, which is heated by the heat generating element 33, and the button battery 52 and grip 4, heat insulation effect is heightened as mentioned above.

As shown in FIG. 5A and FIG. 5B, the second duct 42, the bottom cover 22, the female tripod screw 14a, and the female tripod screw 14b are attached in this order to the bottom side (−Y side) of the codec substrate 79 in which the heat generating element 40 is implemented. Outside air flows through the second duct 42 by driving the second centrifugal fan 41.

Accordingly, the bottom cover 22, the female tripod screw 14a, and the female tripod screw 14b are intercepted from the heat generated by the codec substrate 79. As a result of this, the heat from the codec substrate 79 does not transfer to the bottom cover 22, which reduces discomfort of a photographer who holds the bottom cover 22.

Furthermore, since the air intake duct 45 made from resin of which heat conductivity is lower than that of metal is arranged at the side of the codec substrate 79 rather than the air intake duct plate 46, the female tripod screw 14a, the female tripod screw 14b, and the bottom cover 22, the heat insulation effect is heightened as mentioned above.

In addition, as shown in FIG. 5A, the second duct 42, a recording medium 24a, and a recording medium 24b are arranged in this order at the rear side (−Z side) of the sensor substrate 39. Outside air flows through the second duct 42 by driving the second centrifugal fan 41. Accordingly, the memory media 24a and 24b are intercepted from the heat generated by the sensor substrate 39. As a result of this, the recording media 24a and 24b are protected from the heat generated by the sensor substrate 39.

Figure 7A:
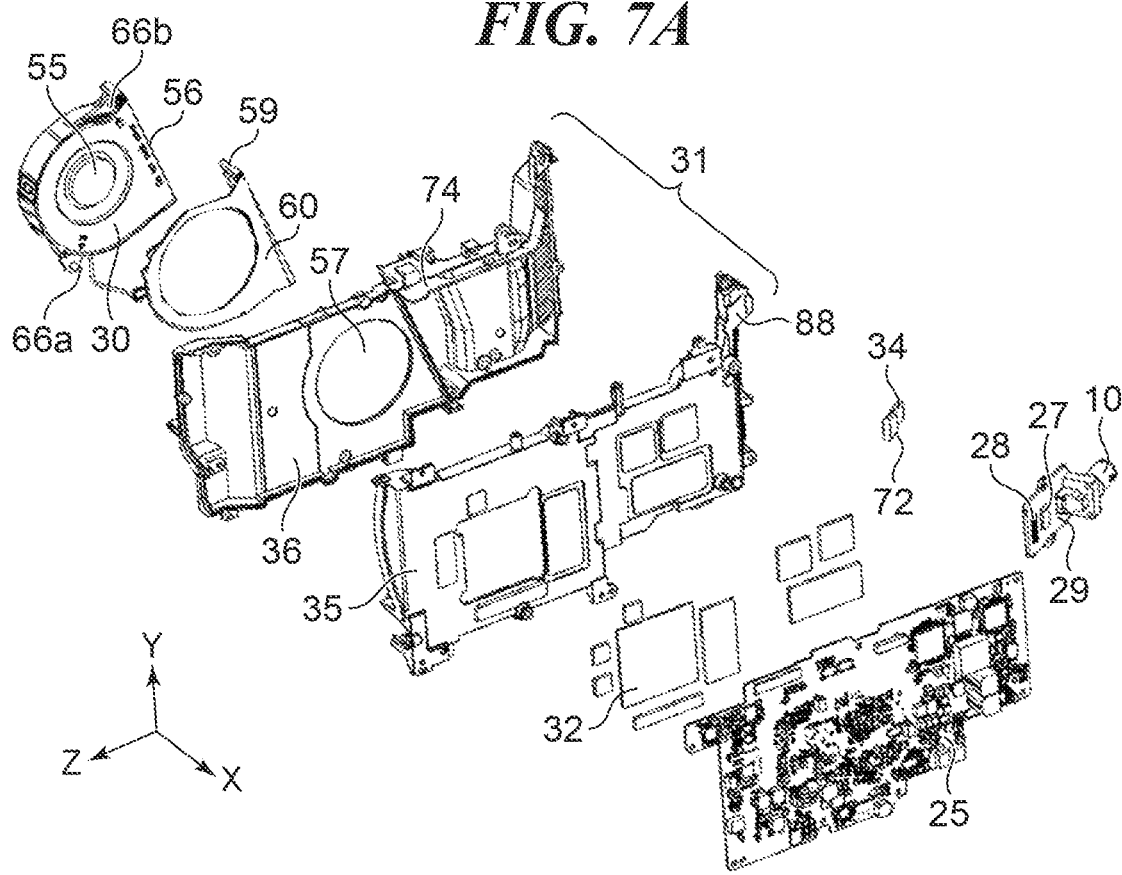
FIG. 7A and FIG. 7B are exploded perspective views for describing a first duct shown in FIG. 3A.
Figure 7B:
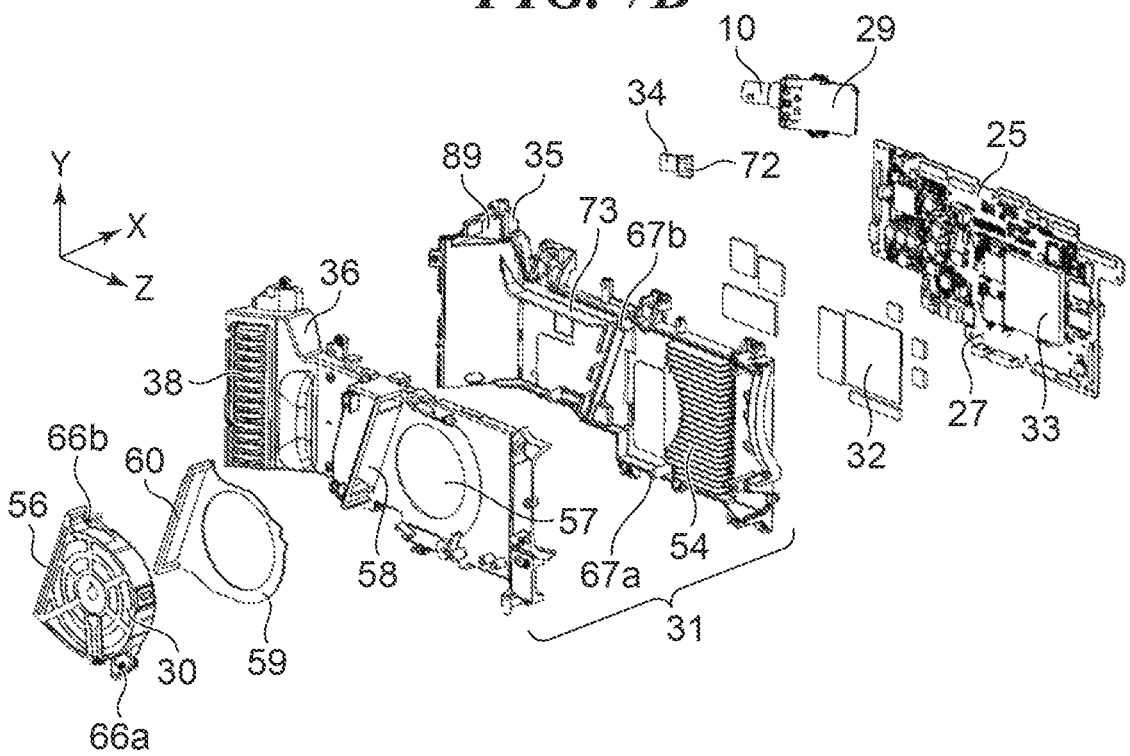

FIG. 7A and FIG. 7B are exploded perspective views for describing the first duct shown in FIG. 3A. FIG. 7A is the exploded perspective view showing the camera viewed from the upper-left side, and FIG. 7B is the exploded perspective view showing the camera viewed from the upper-right side. It should be noted that FIG. 7A and FIG. 7B are the exploded perspective views in the X-direction showing the SDI substrate 29, the main control substrate 25, the first duct 31, and the first centrifugal fan 30.

The second heat conduction member 34, the first heat sink member 35, the duct lid 36, and the first centrifugal fan 30 are arranged in this order at the right side (−X side) of the main control substrate 25. A plurality of radiation fins 54 are integrally formed in the first heat sink member 35 near the first intake port 37 (FIG. 4B) formed in the first heat sink member 35. The radiation fins 54 are approximately parallel to the flow path (flow path part).

A first elastic member 59 that seals a gap between a circumference of a centrifugal-fan intake port 55 and a circumference of a first inlet 57 is attached on the duct lid 36. Furthermore, a second elastic member 60 that fills a gap between a circumference of a centrifugal-fan exhaust port 56 and a circumference of a first outlet 58 is also attached on the duct lid 36. Then, the first elastic member 59 and the second elastic member 60 prevent leakage of wind (air) by keeping a sealed state of the first centrifugal fan 30 and the first duct 31.

In the forced air-cooling mechanism that uses the centrifugal fan and the duct, the centrifugal-fan intake port 55 and centrifugal-fan exhaust port 56 of the first centrifugal fan 30 intersect. Accordingly, the shape of the duct that guides air to the centrifugal-fan intake port 55 and exhausts air from the centrifugal-fan exhaust port 56 becomes complicated. As a result, it is difficult to reduce the number of components of the duct.

Accordingly, the first heat dissipation system has the first inlet 57 on the duct lid 36 for taking air by the first centrifugal fan 30 in addition to the first intake port 37 and first exhaust port 38. Furthermore, the duct lid 36 is provided with a first outlet 58 discharging air by the first centrifugal fan 30.

Thus, since the four openings are formed in the duct lid 36, the first duct 31 consists of two components that are the first heat sink member (duct base) 35 and the duct lid (duct cover) 36, which is capable of reducing the number of components.

Figure 8A:
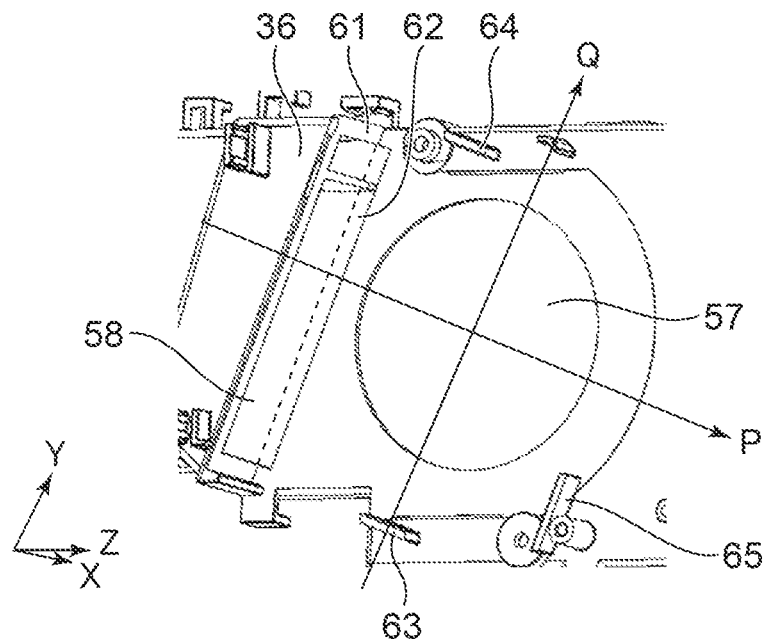
FIG. 8A and FIG. 8B are perspective views showing a first assembly state and a second assembly state of the first duct and a first centrifugal fan that are shown in FIG. 7A.
Figure 8B:
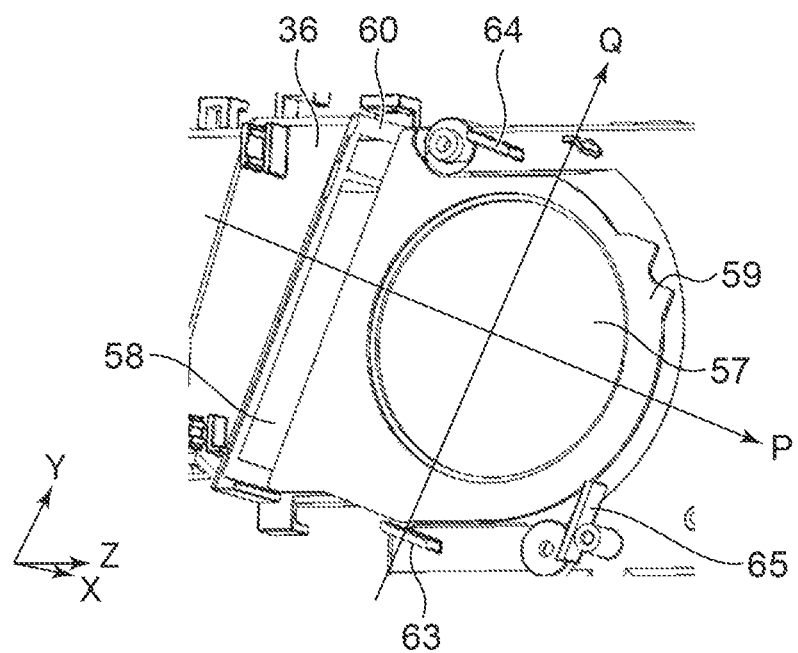
Figure 9A:
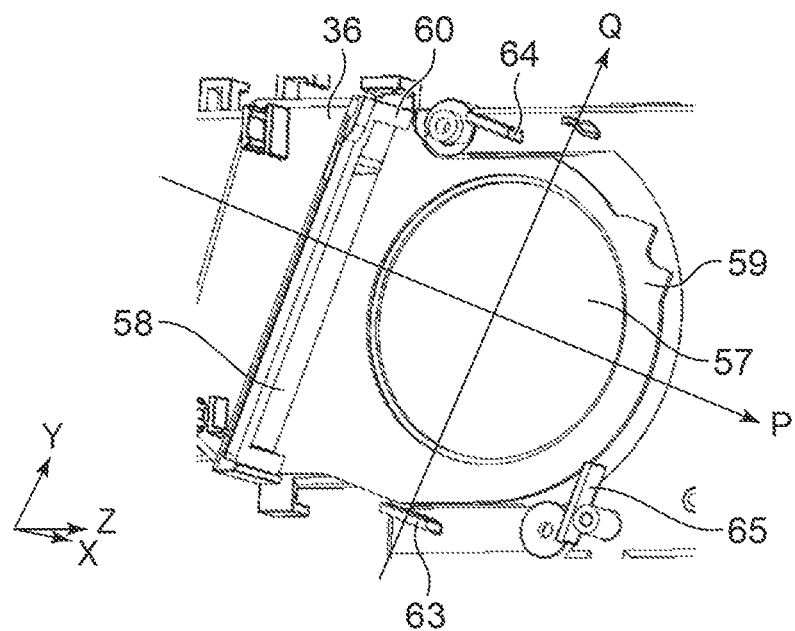
FIG. 9A and FIG. 9B are perspective views showing a third assembly state and a fourth assembly state of the first duct and the first centrifugal fan shown in FIG. 7A.
Figure 9B:
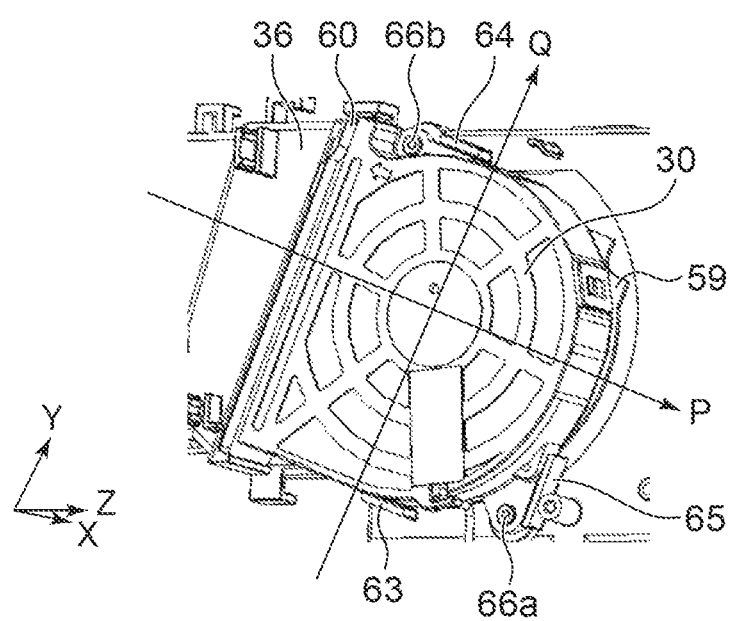

FIG. 8A, FIG. 8B, FIG. 9A, and FIG. 9B are views for describing the assembling of the first duct and first centrifugal fan shown in FIG. 7A. FIG. 8A is a view showing a first assembled state, and FIG. 8B is a view showing a second assembled state. Moreover, FIG. 9A is a view showing a third assembled state, and FIG. 9B is a view showing a fourth assembled state.

It should be noted that FIG. 8A, FIG. 8B, FIG. 9A, and FIG. 9B show the assembly of the duct lid 36, the first elastic member 59, the second elastic member 60, and the first centrifugal fan 30. Moreover, assuming that the center of the first inlet 57 is an origin, a P axis shall be defined as an axis that intersects perpendicularly with a second-elastic-member attachment surface 61 and a Q axis shall be defined as an axis that is parallel to the second-elastic-member attachment surface 61.

As shown in FIG. 8A, when the first inlet 57 and the first outlet 58 in the duct lid 36 that intersect perpendicularly are molded with resin using a metal mold, undercuts occur due to biting of the metal mold. Then, the undercut concerned forms an opening 62.

Accordingly, as shown in FIG. 8B, the first elastic member 59 is shaped so as to fill the opening 62 in order to fill the gap between the circumference of the centrifugal-fan intake port 55 and the circumference of the first elastic member 59. The first elastic member 59 attached on the duct lid 36 prevents the air from flowing out of the first duct 31 through the opening 62.

Next, as shown in FIG. 9A, the second elastic member 60 is attached on the second-elastic-member attachment surface 61. Then, as shown in FIG. 9B, the first centrifugal fan 30 is fitted into a space that is sandwiched between a convex part 63 and a convex part 64 that are parallel to the P axis and that is sandwiched between the convex part 65 that is parallel to the Q axis and the second elastic member 60.

This enables to determine positions of the duct lid 36 and the first centrifugal fan 30. After that, the first centrifugal fan 30 and the duct lid 36 are jointly fastened to screw bosses 67a and 67b (FIG. 7B) of the first heat sink member 35 with screws 66a and 66b. This enables to assemble the first duct 31 and the first centrifugal fan 30.

Figure 10:
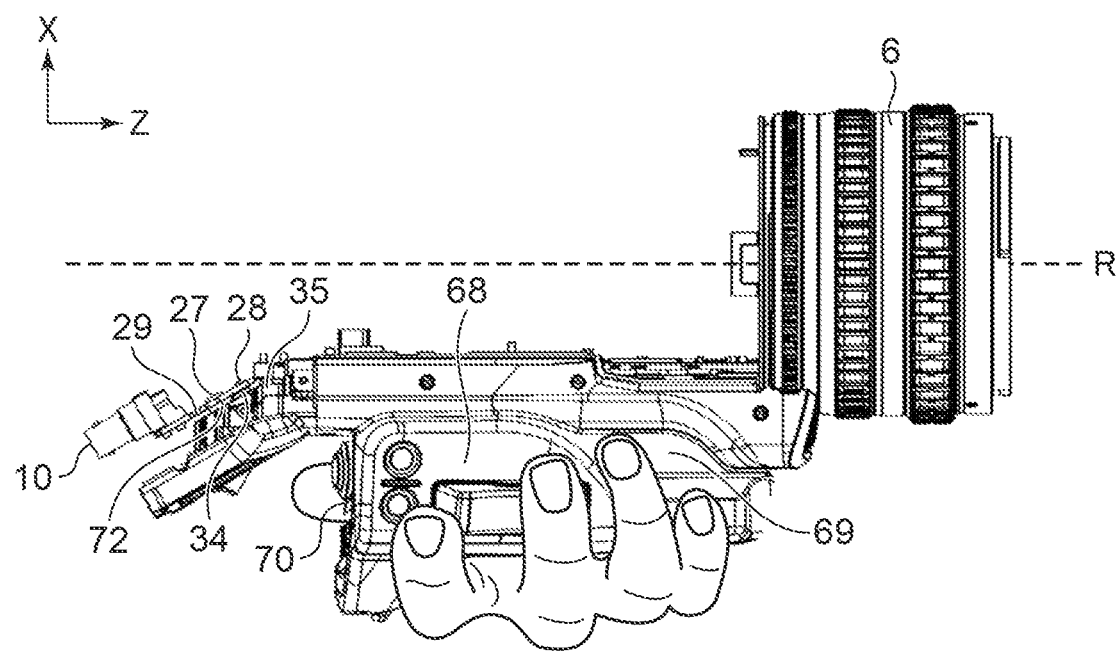
FIG. 10 is a side view showing an operation ring and an L cover of the camera shown in FIG. 1A and FIG. 1B.

FIG. 10 is a view showing the operation ring and an L cover of the camera shown in FIG. 1A. It should be noted that a broken line R in FIG. 10 denote an optical axis of the image pickup lens 3.

Figure 11A:
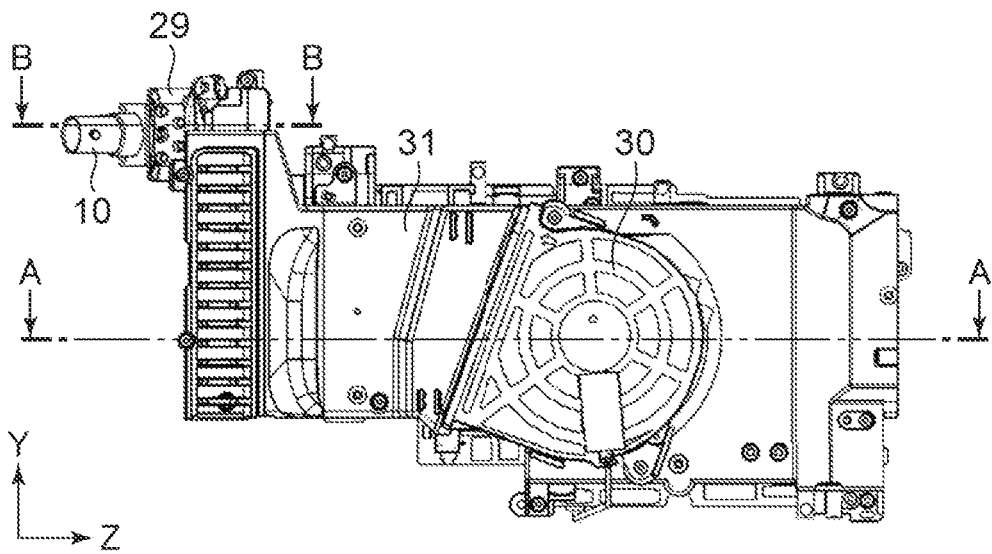
FIG. 11A and FIG. 11B are a side view and a sectional view for describing the first heat dissipation system shown in FIG. 4A and FIG. 4B.
Figure 11B:
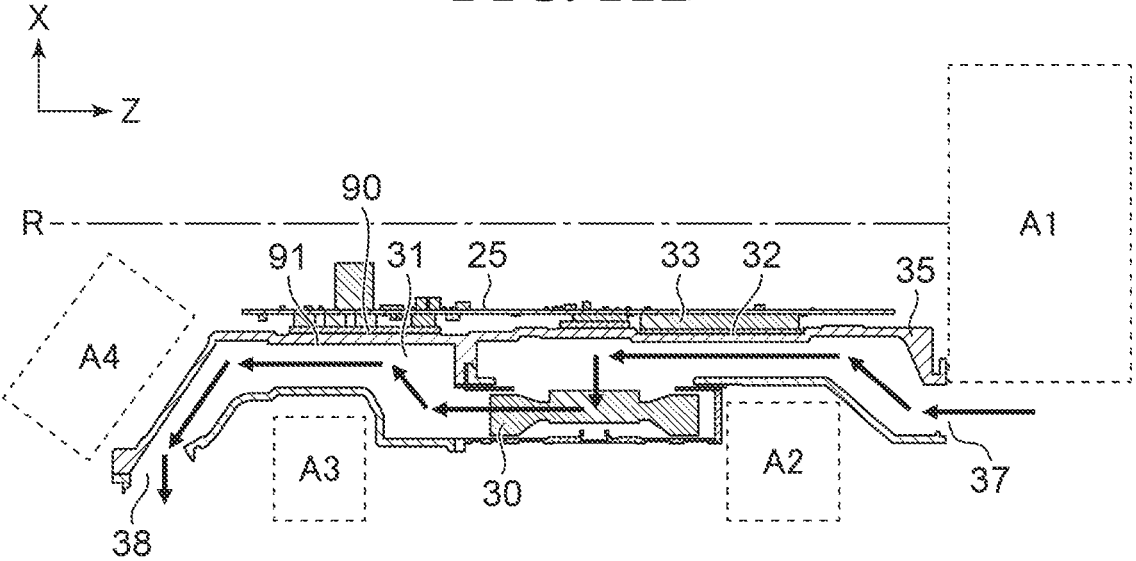

FIG. 11A and FIG. 11B are views for describing the first heat dissipation system shown in FIG. 4A and FIG. 4B. FIG. 11A is a side view viewed from the −X side, and FIG. 11B is a sectional view taken along an A-A line in FIG. 11A. Arrows shown in FIG. 11B show an air stream through the first duct 31.

The operation ring 6 shown in FIG. 10 is located in an area A1 in FIG. 11B. A first finger hold 69 shown in FIG. 10 is a concave region that is used by hooking fingers, such as a third finger and a little finger, when a photographer holds the grip. The first finger hold 69 is located in an area A2 in FIG. 11B.

A second finger hold 70 shown in FIG. 10 is a concave region in which a thumb is located when a photographer holds the grip. The second finger hold 70 is located in an area A3 shown in FIG. 11B. The jacks, such as the SDI output terminal 10, shown in FIG. 10 are located in an area A4 shown in FIG. 11B.

It is preferable that an area of a duct's cross section that intersects perpendicularly with the flow path be constant in order not to form a bottleneck due to ventilation resistance. Accordingly, the first finger hold 69 is arranged in a valley between the operation ring 6 that is apart from the optical axis R shown in FIG. 11B and the first centrifugal fan 30. Moreover, the second finger hold 70 is arranged in a valley between the first centrifugal fan 30 that is apart from the optical axis R and the jacks, such as the SDI output terminal 10. Furthermore, the first duct 31 takes a path that is farther from the optical axis R than the operation ring 6 and is farther from the optical axis R than the jacks, such as the SDI output terminal 10.

Since the above-mentioned layout avoids forming a bottleneck due to duct ventilation resistance, and since the first finger hold 69 and second finger hold 70 approach the center of gravity of the camera 1, it becomes easier that a photographer grasps the camera 1.

Hereinafter, cooling and electric ground of the SDI substrate 29 will be described.

Figure 12A:
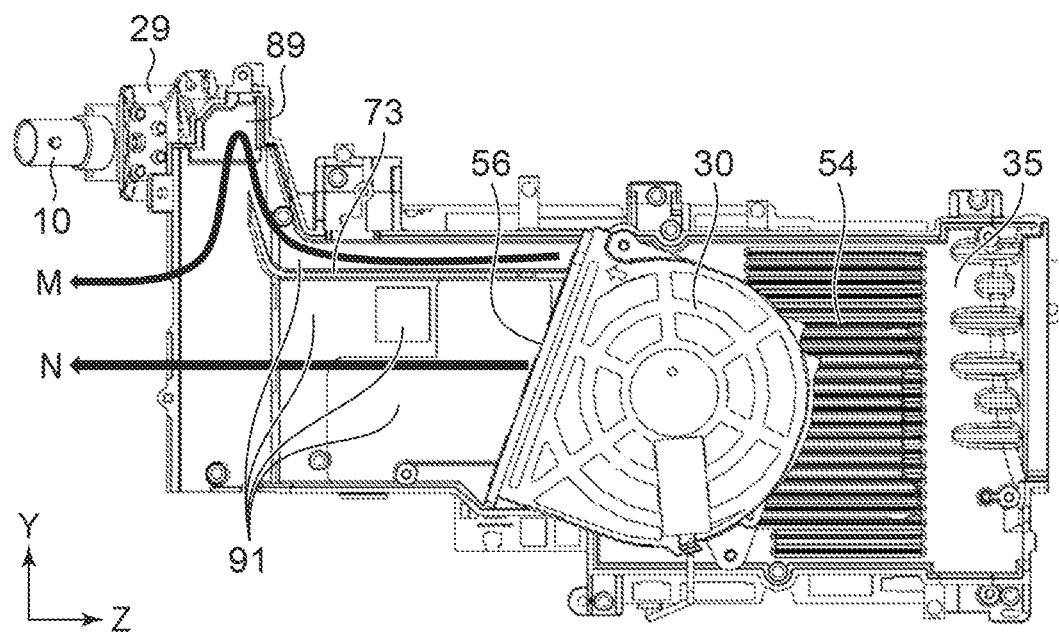
FIG. 12A and FIG. 12B are a side view and a sectional view for describing the flow path in the first duct shown in FIG. 7A.
Figure 12B:
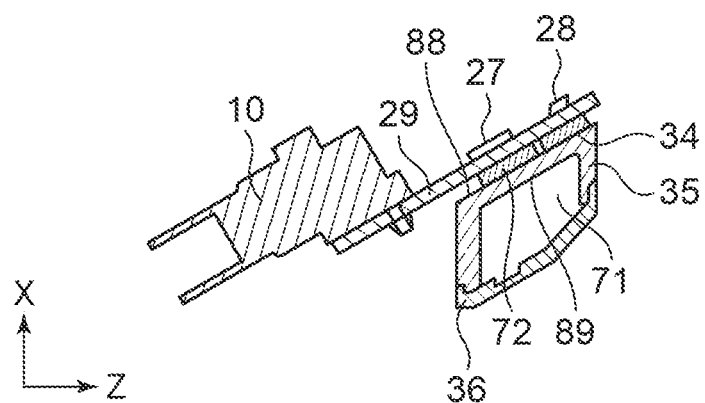

FIG. 12A and FIG. 12B are views for describing the flow path in the first duct shown in FIG. 7A. FIG. 12A is a side view showing the flow path, and FIG. 12B is a sectional view taken along a B-B line in FIG. 11A.

Figure 13A:
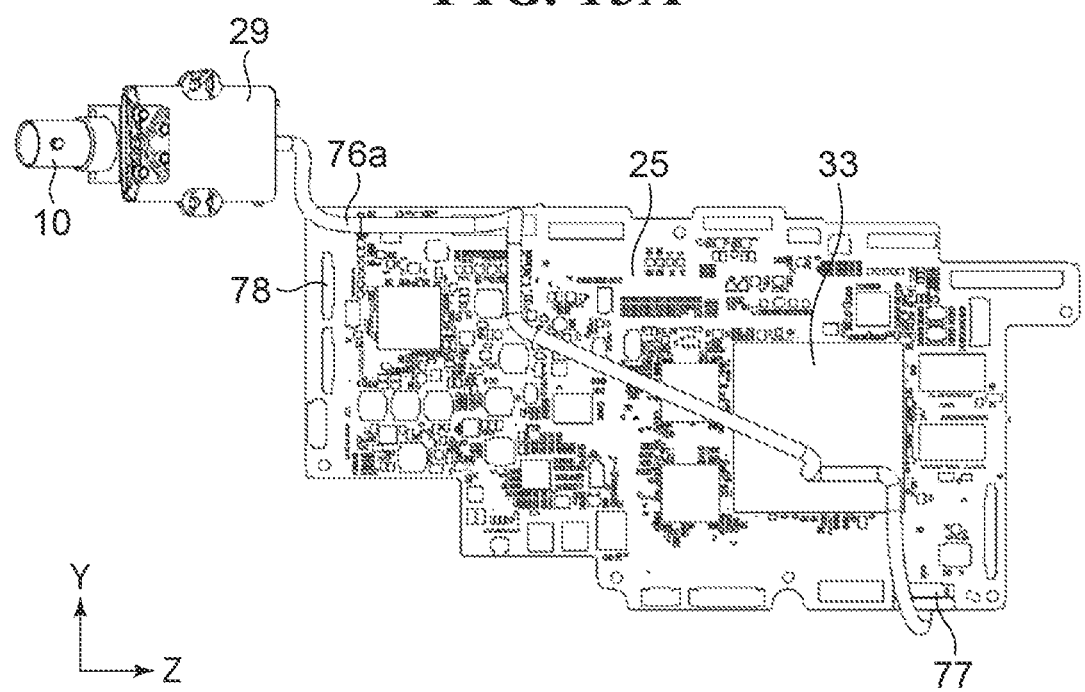
FIG. 13A and FIG. 13B are side views for describing connection between an SDI (Serial Digital Interface) substrate and a main control substrate that are shown in FIG. 7A.
Figure 13B:
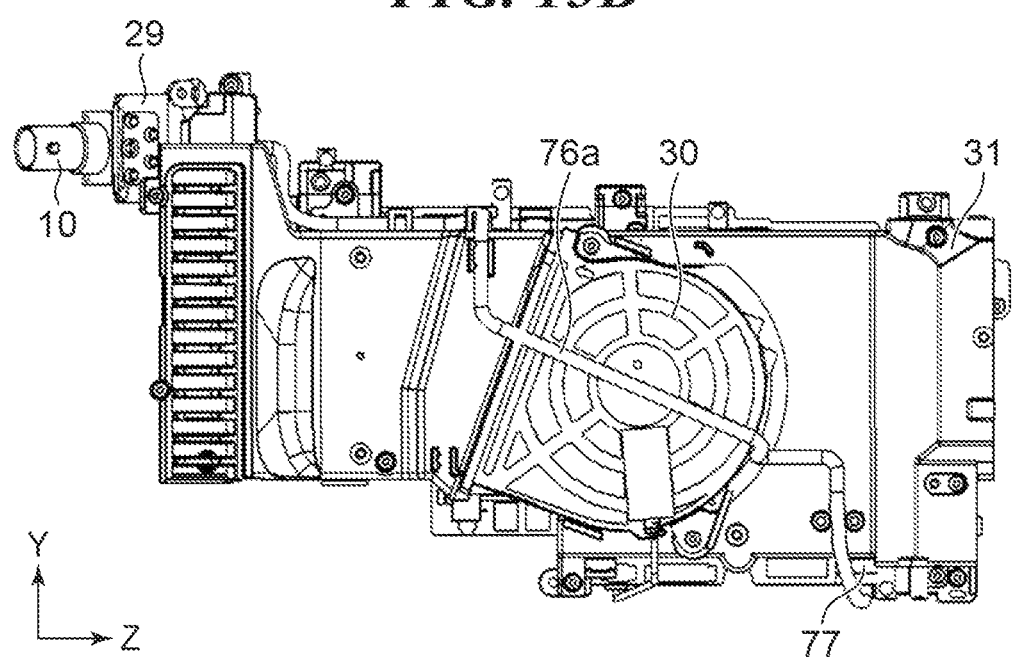

FIG. 13A and FIG. 13B are side views for describing connection between the SDI substrate and the main control substrate that are shown in FIG. 7A. FIG. 13A is the side view showing the SDI substrate and the main control substrate, and FIG. 13B is the side view showing the position of the first centrifugal fan.

In the description by referring to FIG. 7A, FIG. 7B, and FIG. 12B, a surface of the SDI substrate 29 that is opposite to the surface on which the heat generating element 27 is implemented shall be referred to as an opposite surface. The second heat conduction member 34 and a conductive elastic member 72 are arranged side-by-side between the opposite surface concerned and a duct surface 88 that is not parallel to the main control substrate 25 in the first duct 31.

As shown in FIG. 12A, the air discharged from the centrifugal-fan exhaust port 56 is divided by the convex part 73 (FIG. 7B) of the first heat sink member 35 and the convex part 74 (FIG. 7A) of the duct lid 36 and flows along two flow paths shown by arrows M and N.

In FIG. 12A, the arrow M shows the flow path for cooling the SDI substrate 29. As shown by the arrow M, the air discharged from the centrifugal-fan exhaust port 56 passes along a duct surface 91 that is an opposite surface of a duct surface 90 (FIG. 11B) of the first heat sink member 35. After that, the air passes along a duct surface 89 that is an opposite surface of the duct face 88, and is discharged from the first exhaust port 38 (FIG. 11B).

The arrow N shows the flow path for cooling the main control substrate 25. The air discharged from the centrifugal-fan exhaust port 56 passes along the duct surface 91 of the first heat sink member 35, and is discharged from the first exhaust port 38 (FIG. 11A).

The air shown by the arrow M (FIG. 12A) flowing through a flow path 71 shown in FIG. 12B in this way cools the second heat conduction member 34, SDI substrate 29, and SDI output terminal 10.

In the illustrated example, the SDI substrate (external output terminal substrate) 29 is able to send a signal of 3 GHz through 12 GHz (3 GHz or more) to outside through the SDI output terminal 10. Generally, a substrate that sends a signal of a high frequency band tends to generate powerful spurious radiation to outside of the camera 1. When a long loop path is formed from the SDI substrate 29 to a main electric around of the camera 1 particularly, the spurious radiation increases due to theoretical characteristics of a dipole antenna.

In view of this, the electric ground of the SDI substrate 29 and the duct surface 88 of the first heat sink member 35 that is the main electric ground of the camera 1 are connected by the conductive elastic member 72 at the shortest to reduce the spurious radiation.

The above-mentioned spurious radiation occurs in a wire (conductor) 76a (FIG. 13A) that connects the SDI substrate 29 and the main control substrate 25. An SDI output signal is generated by the heat generating element 33 implemented in the main control substrate 25. The wire 76a connects the connector 28 of the SDI substrate 29 with a connector 77 of the main control substrate 25.

Such connection minimizes the distance from the connector 77 to the heat generating element 33. For example, if the wire 76a is connected to the connector 78 of the main control substrate 25, the SDI output signal appears on the circuit pattern from the heat generating element 33 implemented in the main control substrate 25 to the connector 78. As a result of this, the spurious radiation occurs from the entire main control substrate 25. In order to avoid such a phenomenon, the distance from the connector 77 to the heat generating element 40 is minimized.

If the wire 76a passes between the main control substrate 25 and the first duct 31, the SDI output signal appears on the circuit pattern of the outer layer of the main control substrate 25. As a result of this, the spurious radiation occurs from the entire main control substrate 25. In view of this, the illustrated example is so configured that the wire 76a passes through the upper side (+Y side) of the first duct 31 as shown in FIG. 13B.

As described above, the SDI substrate 29 and the electric ground of the first duct 31 are connected by the conductive elastic member 72 at the shortest. Furthermore, the first duct 31 keeps a distance between the main control substrate 25 and the wire 76a. This reduces the spurious radiation generated from the SDI substrate 29.

Figure 14A:
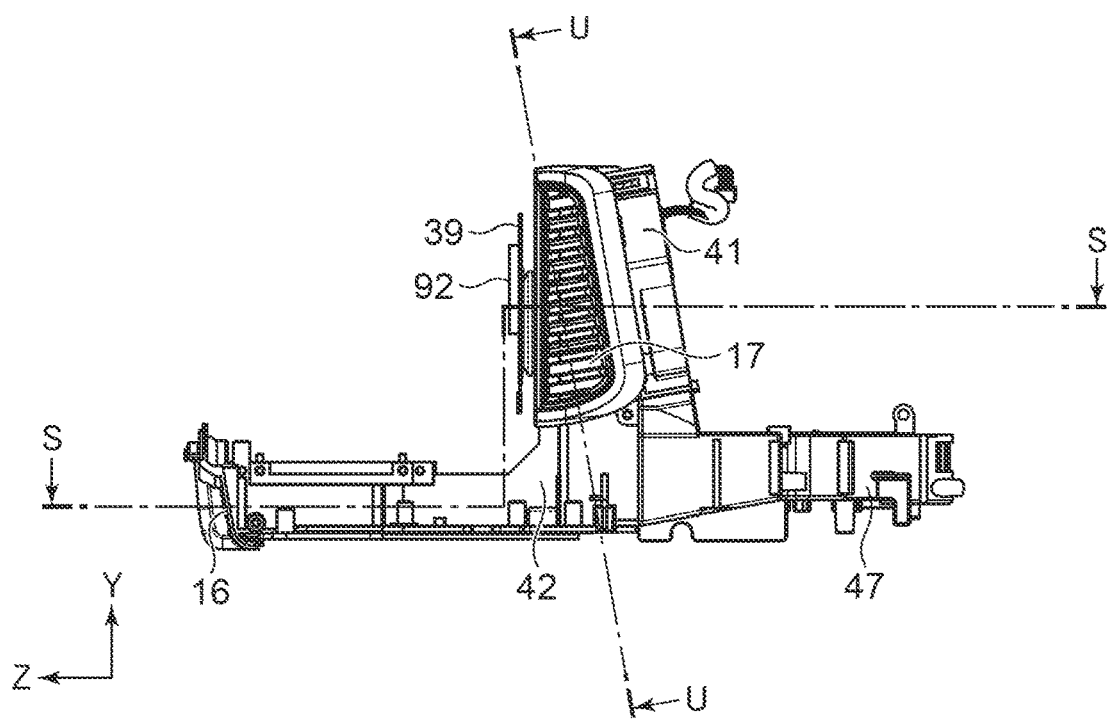
FIG. 14A and FIG. 14B are a side view and a front view for describing the second heat dissipation system shown in FIG. 5A and FIG. 5B.
Figure 14B:
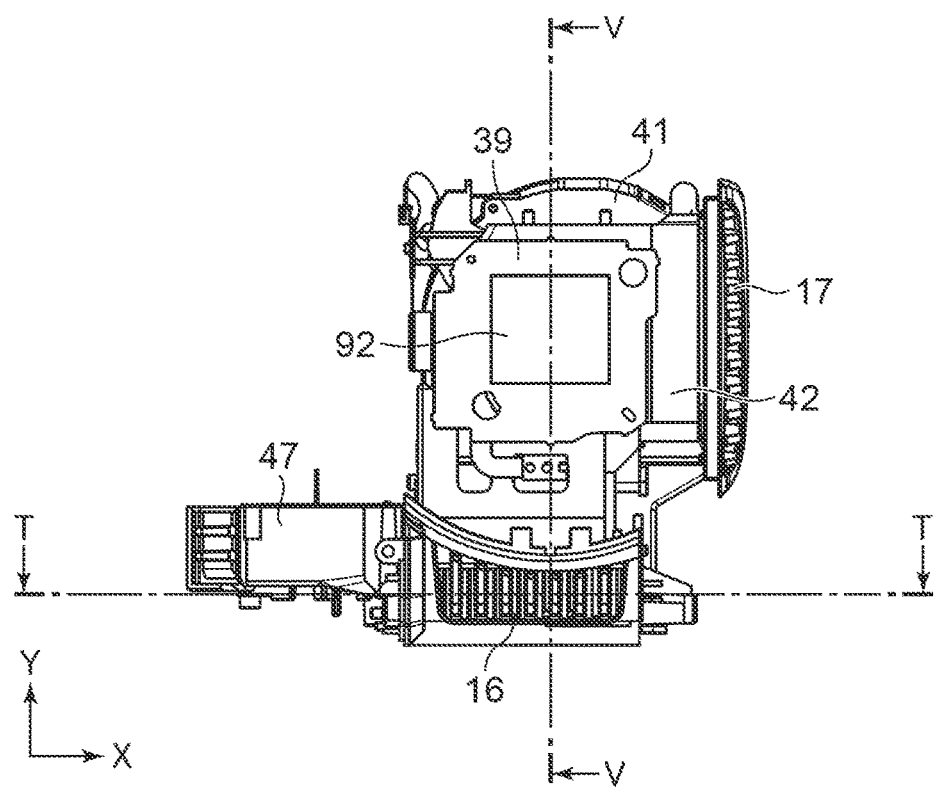

FIG. 14A and FIG. 14B are a side view and a front view for describing the second heat dissipation system shown in FIG. 5A and FIG. 5B. Moreover, FIG. 15 is a sectional view taken along an S-S line shown in FIG. 14A.

Figure 15:
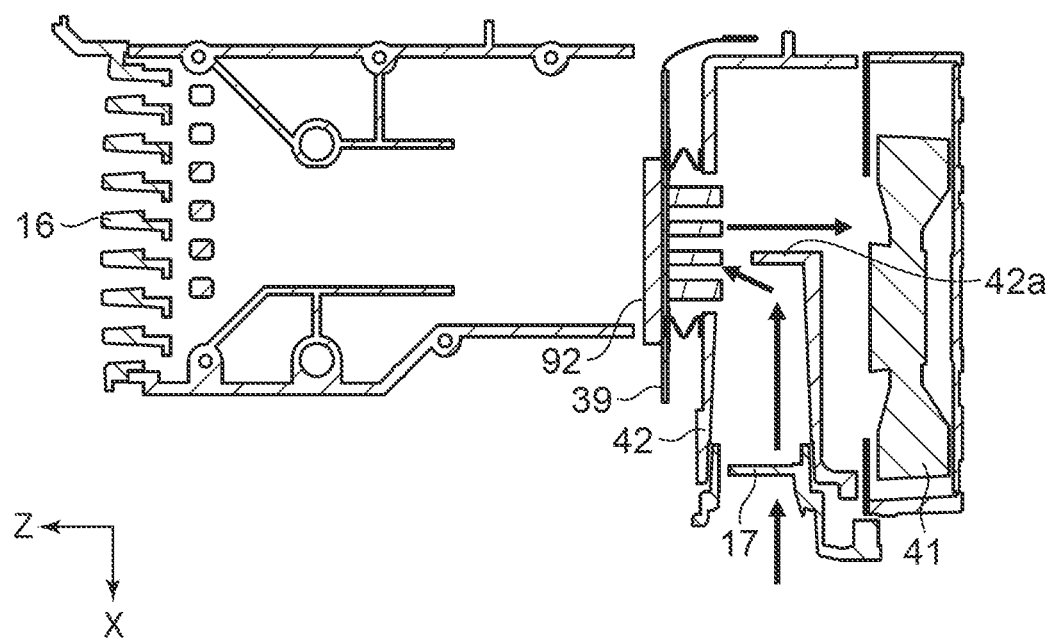
FIG. 15 is a sectional view taken along an S-S line in FIG. 14A.

As shown in FIG. 15, the second heat dissipation system is provided with the second body intake port 16, the third body intake port 17, the second centrifugal fan 41, and the second duct 42. The second heat dissipation system cools the sensor substrate 39 and the image pickup device 92.

As described in relation to FIG. 5A and FIG. 5B, the second centrifugal fan 41 inhales outside air from the second body intake port 16 and the third body intake port 17, and cools the heat generating element 40 and the sensor substrate 39. As particularly shown in FIG. 15, the air inhaled from the third body intake port 17 cools the sensor substrate 39 through the second duct 42.

In the illustrated camera 1, the distance from the second centrifugal fan 41 to the second body intake port 16 is longer than the distance from the second centrifugal fan 41 to the third body intake port 17. Accordingly, if no measure is applied, the amount of outside air inhaled from the second body intake port 16 be small and the amount of outside air inhaled from the third body intake port 17 be large, which lowers a cooling efficiency.

In view of this, the second duct 42 is provided with a rising wall 42a for changing the wind direction to the direction toward the sensor substrate 39. The rising wall 42a is arranged so as to obstruct the flow path from the third body intake port 17 to the second centrifugal fan 41.

The rising wall 42a increases the ventilation resistance in the second duct 42. When the ventilation resistance for the outside air inhaled from the third body intake port 17 increases, the outside air is inhaled effectively even from the second body intake port 16 from which the distance to the second centrifugal fan 41 is long. As a result, the cooling efficiency in the camera 1 improves. Furthermore, since the rising wall 42a directs the air toward the sensor substrate 39, the sensor substrate 39 is cooled efficiently.

Figure 16A:
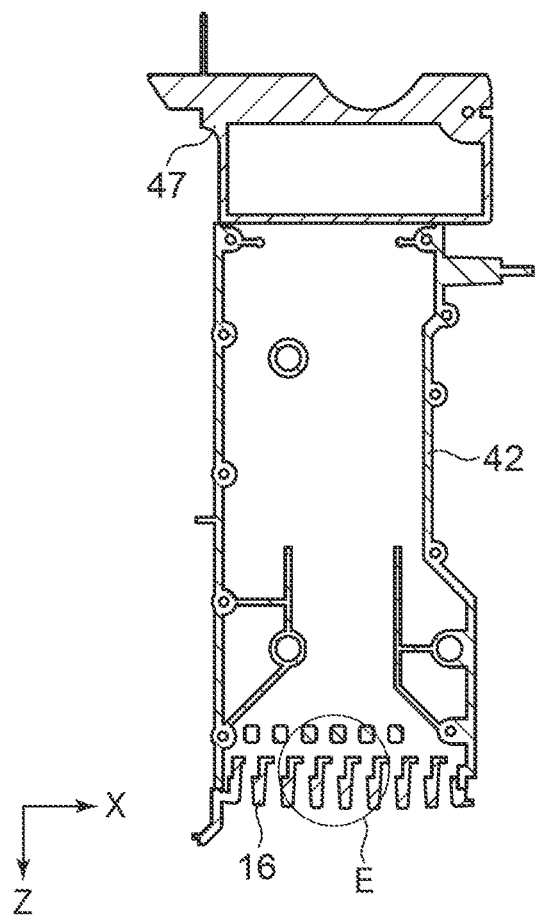
FIG. 16A is a sectional view taken along a T-T line in FIG. 14B
Figure 16B:
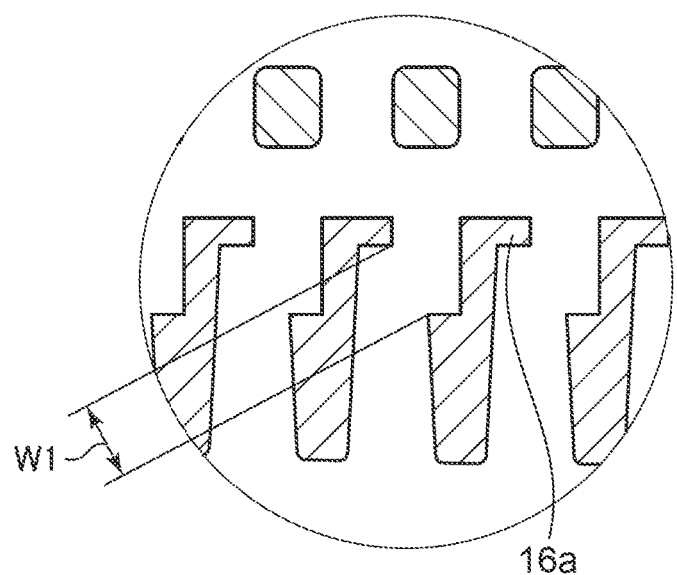
FIG. 16B is an enlarged view thereof.

FIG. 16A is a sectional view taken along a T-T line in FIG. 14B, and FIG. 16B is an enlarged view of a part E in FIG. 16A.

Second-body-intake-port rising walls 16a are formed in the second body intake port 16 so that components built in the camera 1 will be hardly viewed from outside. The second-body-intake-port rising walls 16a are arranged so as to partially close the openings of the second body intake port 16. As a result of this, the inner components are hardly viewed from outside, which improves quality of the camera.

As shown in FIG. 16B, a width of an air flow path of which one end is formed by the second-body-intake-port rising wall 16a is denoted as W1. When the flow path width W1 increases, the ventilation resistance decreases and the amount of inhaling air increases.

Figure 17A:
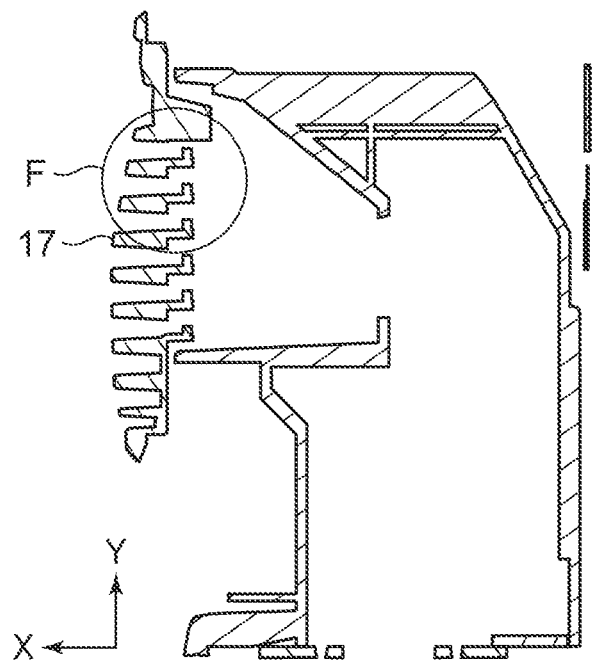
FIG. 17A is a sectional view taken along a U-U line in FIG. 14A
Figure 17B:
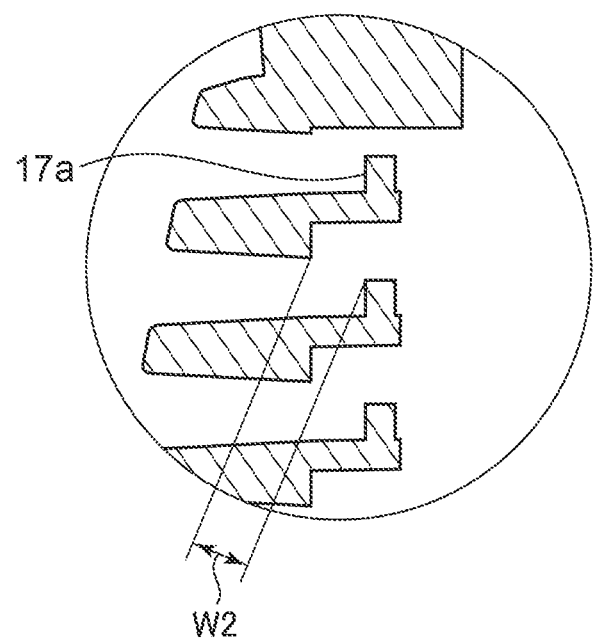
FIG. 17B is an enlarged view thereof.

FIG. 17A is a sectional view taken along a U-U line in FIG. 14A, and FIG. 17B is an enlarged view of a part F in FIG. 17A.

Third-body-intake-port rising walls 17a are formed in the third body intake port 17 so that components built in the camera 1 will be hardly viewed from outside. The third-body-intake-port rising walls 17a function so that the inner components will be hardly viewed from outside as with the second-body-intake-port rising walls 16a shown in FIG. 16B, which improves the quality of the camera.

As shown in FIG. 17B, a width of an air flow path of which one end is formed by the third-body-intake-port rising wall 17a is denoted as W2. When the flow path width W2 increases, the ventilation resistance decreases and the amount of inhaling air increases.

As described above, in the illustrated camera 1, the distance from the second centrifugal fan 41 to the second body intake port 16 is longer than the distance from the second centrifugal fan 41 to the third body intake port 17. Accordingly, if no measure is applied, the amount of outside air inhaled from the second body intake port 16 be small and the amount of outside air inhaled from the third body intake port 17 be large, which lowers a cooling efficiency. In view of this, the illustrated camera 1 is designed so as to satisfy the following condition about the flow path widths W1 and W2:

W1>W2, where

W1: Flow path width in the second body intake port 16, and W2: Flow path width in the third body intake port 17.

In this way, when the flow path width (cross-sectional area) of the second body intake port 16 is larger than the flow path width (cross-sectional area) of the third body intake port 17, the ventilation resistance in the third body intake port 17 becomes larger than that in the second body intake port 16. As a result, the outside air is properly inhaled even from the second body intake port 16, which improves the cooling efficiency.

Figure 18:
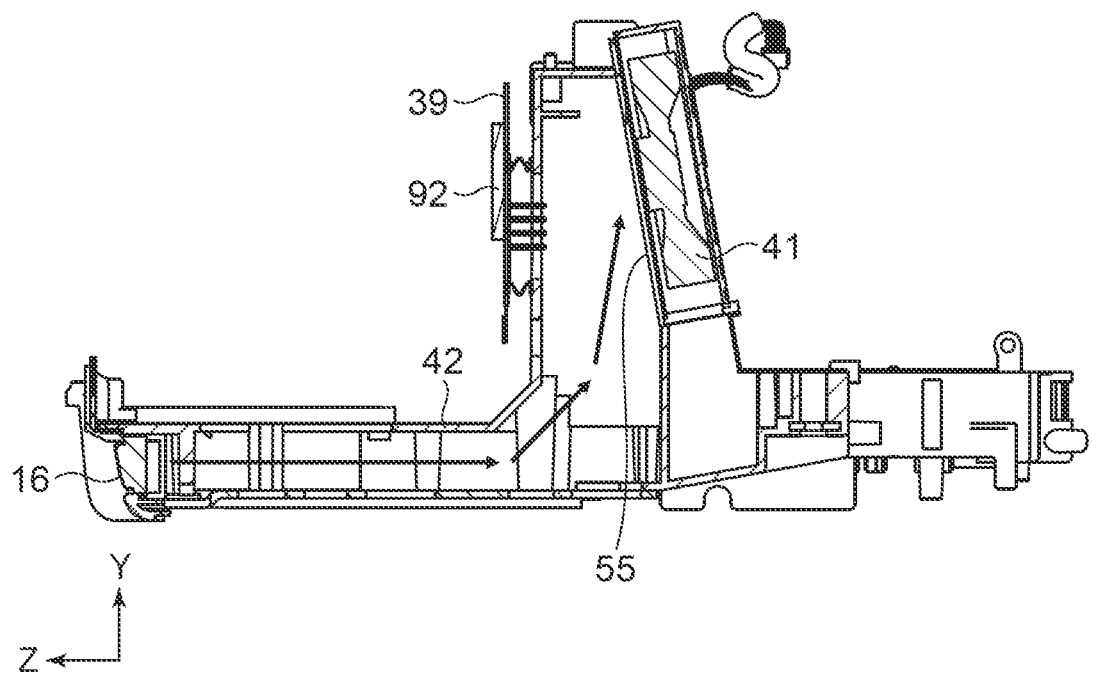
FIG. 18 is a sectional view taken along a V-V line shown in FIG. 14B.

FIG. 18 is a sectional view taken along a V-V line shown in FIG. 14B.

As illustrated, the second heat dissipation system is provided with the second body intake port 16, the second duct 42, the second centrifugal fan 41, and the centrifugal-fan intake port 55. The image pickup device 92 is arranged in the second heat dissipation system.

In the illustrated camera 1, the second centrifugal fan 41 is arranged in an inclined manner so that an intake surface of the centrifugal-fan intake port (ventilation inlet) 55 is directed toward the second body intake port 16. Thus, the ventilation resistance of the air passing through the second duct 42 is reduced by inclining the second centrifugal fan 41.

This increases the amount of the air inhaled from the second body intake port 16 and improves the cooling efficiency.

As described above, in the camera 1 of the first embodiment, the rising wall 42a is formed in the second duct 42, and the flow path width (cross-sectional area) of the second body intake port 16 is larger than that of the third body intake port 17. Moreover, the second centrifugal fan 41 is arranged in the inclined manner. As a result of this, the ventilation resistance is adjusted and the cooling efficiency is improved.

Subsequently, one example of a camera according to a second embodiment of the present invention will be described. Since configuration of the camera in the second embodiment is the same as that of the camera shown in FIG. 1A through FIG. 3B, only parts different from the camera in the first embodiment will be described.

Figure 19A:
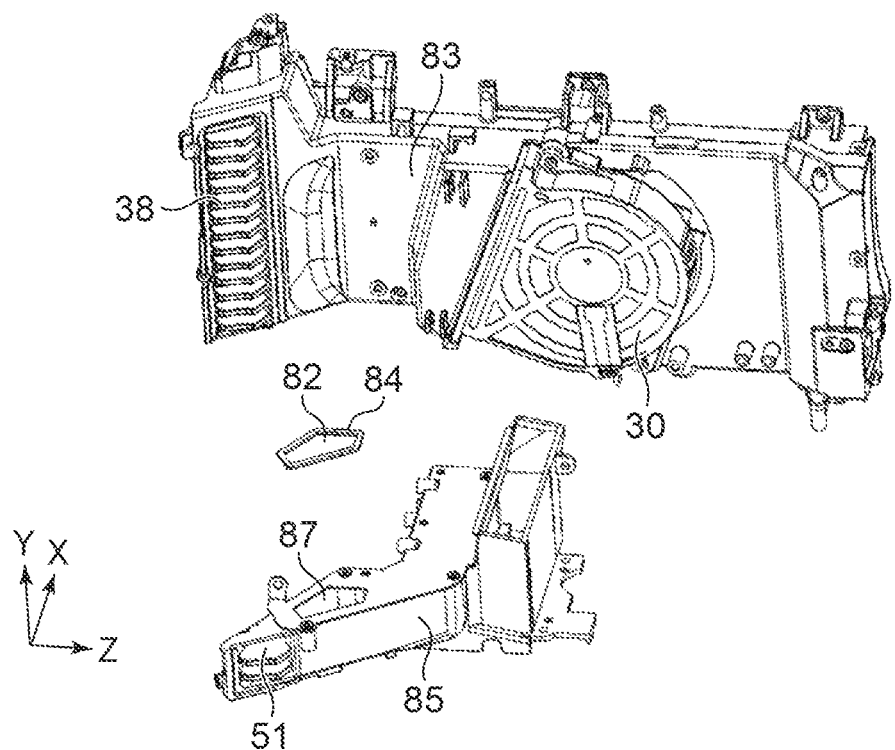
FIG. 19A and FIG. 19B are exploded perspective views for describing an example of a heat dissipation mechanism of a camera according to a second embodiment of the present invention.
Figure 19B:
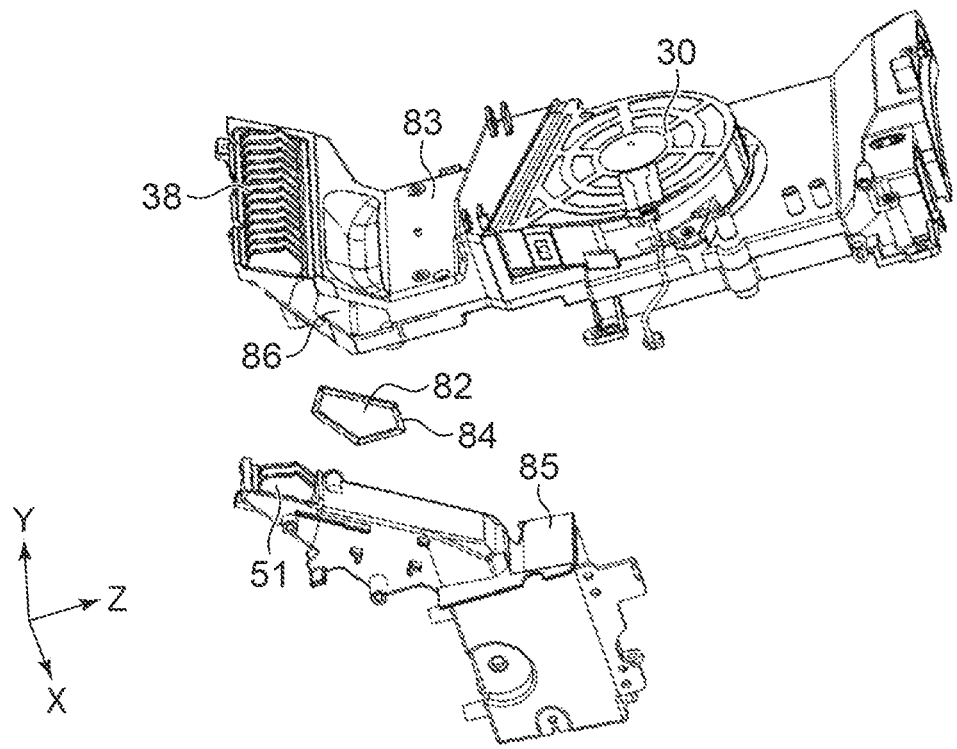

FIG. 19A and FIG. 19B are exploded perspective views for describing an example of a heat dissipation mechanism of the camera according to the second embodiment of the present invention. FIG. 19A and FIG. 19B are the exploded perspective views showing a third duct 83, an elastic member 84 having an opening 82, and a second exhaust duct 85 viewed in the X-direction and the Y-direction, respectively.

A heat generation amount of the main control substrate 25 (FIG. 3A) is more than a sum of a heat generation amount of the codec substrate 79 (FIG. 3B) and a heat generation amount of the sensor substrate 39 (FIG. 3B). Moreover, the ventilation resistance of the first duct 31 is smaller than the ventilation resistance of the second duct 42. And, the first centrifugal fan 30 and the second centrifugal fan 41 are driven at an almost identical rotation frequency in order to avoid a beats phenomenon of the fans.

As a result, the exhaust wind exhausted from the first exhaust port 38 exhibits a lower flow velocity and a higher temperature as compared with the exhaust wind exhausted from the second exhaust port 51. The exhaust wind from the second exhaust port 51 exhibits a higher flow velocity and a lower temperature. The high temperature of the exhaust wind from the first exhaust port 38 and that the high flow velocity of the exhaust wind from the second exhaust port 51 may give a user displeasure.

In view of this, the flow velocities and the temperatures of the two exhaust winds are equalized by mixing the exhaust wind from the first exhaust port 38 and the exhaust wind from the second exhaust port 51 within the camera 1 to reduce the displeasure that the user feels.

In the second embodiment, the third duct 83 is constituted by forming an opening 86 in the first duct 31 (FIG. 3A). Furthermore, the second exhaust duct 85 is constituted by forming an opening 87 in the exhaust duct 47 (FIG. 3A). Then, the elastic member 84 in which the opening 82 is formed is arranged between the third duct 83 and the second exhaust duct 85 in a state where the elastic member 84 is energized to the two ducts. It should be noted that the openings 87, 82, and 86 have the almost same size and are connected in the Y-direction.

As a result of this, a part of the air that passes through the third duct 83 at the high flow velocity enters into the third duct 83, is mixed with the air that passes through the third duct 83, and is exhausted from the first exhaust port 38.

As described above, in the second embodiment, the displeasure that a user feels is reduced by reducing the differences in the temperature and the flow velocity between the exhaust wind from the first exhaust port 38 and the exhaust wind from the second exhaust port 51.

As mentioned above, the embodiments of the present invention avoid the heat transfer to the grip while keeping the image pickup lens unit at a uniform temperature. Furthermore, outside air is effectively taken in from the intake ports and the heat sources are efficiently cooled without increasing the number of components. Moreover, the spurious radiation is reduced.

Although the embodiments of the invention have been described, the present invention is not limited to the above-mentioned embodiments, the present invention includes various modifications as long as the concept of the invention is not deviated. For example, although the video camera is exemplified and described in the above-mentioned embodiments, the present invention is applicable to another electronic apparatus equipped with an image pickup lens unit. Furthermore, the present invention is applicable to an electronic apparatus that has a heat source and discharges heat generated by the heat source to outside.

OTHER EMBODIMENTS

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-051131, filed Mar. 19, 2018, which is hereby incorporated by reference herein in its entirety.

What is claimed is:

1. An electronic apparatus that obtains an image signal corresponding to an optical image formed through an image pickup lens, the electronic apparatus comprising:

a first substrate, which includes a first heat generating element, arranged at a side of a grip formed in a housing of the electronic apparatus;

a second substrate, which includes a second heat generating element, arranged at a side opposite to an image pickup direction of the image pickup lens;

a third substrate, which includes a third heat generating element, arranged at a position nearer to a bottom of the electronic apparatus than the image pickup lens;

a first duct including a first connection part that connects to the first heat generating element thermally;

a second duct including a second connection part and a third connection part that respectively connect to the second substrate and the third substrate thermally;

a first blower connected to the first duct; and a second blower connected to the second duct.

2. The electronic apparatus according to claim 1, further comprising:

the housing, which includes an intake port through which air is drawn in by the first blower and the second blower from, and an exhaust port, wherein the drawn in air passes through the first duct and the second duct and is exhausted from the exhaust port.

3. The electronic apparatus according to claim 1, further comprising:

a heat generating element, each of the first duct and the second duct is configured so that a surface at a side of the heat generating element differs in heat conductivity from a surface at a side of the housing.

4. The electronic apparatus according to claim 3, wherein the heat conductivity of the surface at the side of the heat generating element is higher than the heat conductivity of the surface at the side of the housing.

5. The electronic apparatus according to claim 3, wherein the heat conductivity of the surface at the side of the housing is higher than the heat conductivity of the surface at the side of the heat generating element.

6. The electronic apparatus according to claim 1, wherein the second heat generating element is an image pickup device that outputs the image signal corresponding to the optical image formed through the image pickup lens.

7. The electronic apparatus according to claim 6, wherein the first substrate is used for applying a predetermined image process to the image signal output from the image pickup device.

\* \* \* \* \*